(12) United States Patent
Park

(10) Patent No.: US 12,501,773 B2
(45) Date of Patent: Dec. 16, 2025

(54) DISPLAY DEVICE FOR IMPROVING DISPLAYING QUALITY AND DISPLAY PANEL THEREOF

(71) Applicant: LG Display Co., Ltd., Seoul (KR)

(72) Inventor: TaeYoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 505 days.

(21) Appl. No.: 17/994,776

(22) Filed: Nov. 28, 2022

(65) Prior Publication Data

US 2023/0200135 A1 Jun. 22, 2023

(30) Foreign Application Priority Data

Dec. 22, 2021 (KR) .................. 10-2021-0185276

(51) Int. Cl.
*G09G 3/30* (2006.01)
*H10D 86/40* (2025.01)
(Continued)

(52) U.S. Cl.
CPC ....... *H10K 59/1213* (2023.02); *H10D 86/441* (2025.01); *H10D 86/60* (2025.01); *H10K 59/131* (2023.02); *H10K 59/65* (2023.02)

(58) Field of Classification Search
CPC .. G09G 3/3225; G09G 3/3266; G09G 3/3275; G09G 2300/0426;
(Continued)

(56) References Cited

U.S. PATENT DOCUMENTS 7,173,590 B2 * 2/2007 Uchino ................ G02B 6/4214
345/82
7,535,442 B2 * 5/2009 Yamashita ........... G09G 3/3266
315/169.3
(Continued)

FOREIGN PATENT DOCUMENTS

CN 102314829 A 1/2012
CN 111490075 A 8/2020
(Continued)

OTHER PUBLICATIONS

Korean Intellectual Property Office, Notice of Allowance, Korean Patent Application No. 10-2021-0185276, Jun. 23, 2025, 14 pages.
(Continued)

*Primary Examiner* — Joe H Cheng
(74) *Attorney, Agent, or Firm* — Fenwick & West LLP

(57) ABSTRACT

A display panel comprises: a pixel in a display area of the display panel, the pixel including: a light emitting device configured to emit light responsive to a driving current; a driving transistor configured to supply the driving current; and a plurality of switching transistors configured to control the supply of the driving current to the light emitting device by the driving transistor, wherein at least one of the plurality of switching transistors is configured to provide a path to ground through which an excitation current exits within the pixel. Accordingly, it is possible to improve the brightness phenomenon occurring due to an unintentionally increased amount of current in the pixel adjacent to the through hole, thereby the image quality may be improved.

19 Claims, 13 Drawing Sheets

(51) Int. Cl.
*H10D 86/60* (2025.01)
*H10K 59/121* (2023.01)
*H10K 59/131* (2023.01)
*H10K 59/65* (2023.01)

(58) Field of Classification Search
CPC .......... G09G 2320/0233; H10K 50/86; H10K 50/841; H10K 59/65; H10K 59/121; H10K 59/1216; H10K 59/131; H10K 86/60; H10K 86/141
See application file for complete search history.

(56) References Cited

U.S. PATENT DOCUMENTS

| | | | | |
|---|---|---|---|---|
| 7,646,363 | B2 * | 1/2010 | Yamashita | G09G 3/3233 345/82 |
| 7,659,872 | B2 * | 2/2010 | Yamashita | G09G 3/3233 345/206 |
| 7,834,823 | B2 * | 11/2010 | Uchino | G09G 3/3266 345/94 |
| 8,253,665 | B2 * | 8/2012 | Nathan | G09G 3/3233 345/82 |
| 8,599,222 | B2 * | 12/2013 | Ishiguro | G09G 3/3233 345/204 |
| 9,824,632 | B2 * | 11/2017 | Chaji | H05B 47/10 |
| 11,056,060 | B2 * | 7/2021 | Kim | G09G 3/3233 |
| 11,462,152 | B2 * | 10/2022 | Kim | G09G 3/32 |
| 2008/0018629 | A1 | 1/2008 | Uchino et al. | |
| 2012/0001893 | A1 | 1/2012 | Jeong et al. | |
| 2015/0364083 | A1 * | 12/2015 | Jeon | G09G 3/3233 345/76 |
| 2017/0124941 | A1 * | 5/2017 | Na | G09G 3/2092 |
| 2017/0345371 | A1 * | 11/2017 | Son | G09G 3/3258 |
| 2018/0293939 | A1 * | 10/2018 | Kim | H10K 59/131 |
| 2019/0172888 | A1 * | 6/2019 | Choi | G09G 3/3258 |
| 2020/0243635 | A1 | 7/2020 | Lee et al. | |
| 2021/0193055 | A1 | 6/2021 | Lee et al. | |
| 2021/0202588 | A1 | 7/2021 | Cho et al. | |
| 2021/0366397 | A1 * | 11/2021 | Na | G09G 3/3291 |
| 2023/0360600 | A1 | 11/2023 | Wang et al. | |

FOREIGN PATENT DOCUMENTS

| | | |
|---|---|---|
| CN | 113130574 A | 7/2021 |
| CN | 113140179 A | 7/2021 |
| KR | 10-2019-0134105 A | 12/2019 |
| KR | 10-2021-0081538 A | 7/2021 |
| KR | 10-2021-0083967 A | 7/2021 |
| KR | 10-2021-0086331 A | 7/2021 |

OTHER PUBLICATIONS

China National Intellectual Property Administration, Office Action, Chinese Patent Application No. 202211616952.7, Aug. 2, 2025, 15 pages.

* cited by examiner

DISPLAY DEVICE FOR IMPROVING DISPLAYING QUALITY AND DISPLAY PANEL THEREOF

CROSS REFERENCE TO RELATED APPLICATION

This application claims priority from Republic of Korea Patent Application No. 10-2021-0185276, filed on Dec. 22, 2021, which is hereby incorporated by reference in its entirety.

TECHNICAL FIELD

Embodiments of the present disclosure relate to a display device and a display panel, more particularly, to a display device and a display panel capable of improving a brightness phenomenon around a through hole.

BACKGROUND

A display device implementing a variety of information on a screen is an important technology in the information and communication era, and has been developing in the direction of thinner, lighter, and more portable and high-performance. Accordingly, a display device capable of being manufactured in a lightweight and thin form has been in the spotlight. A display device using a self-luminous element is not only advantageous in terms of power consumption due to low voltage driving, but also has an excellent high-speed response speed, a high luminous efficiency, a large viewing angle, and a high contrast ratio, and is being studied as a next-generation display device. The display device implements an image through a plurality of sub-pixels that are arranged in a matrix form. Each of the plurality of sub-pixels includes a light emitting device and a pixel circuit such as a plurality of transistors independently driving the light emitting device.

Specific examples of such a display device (for example, a flat panel display) may include a liquid crystal display (LCD), a quantum dot display (QD), a field emission display apparatus (FED), an organic light emitting diode (OLED) display, etc. The organic light emitting diode (OLED) display, which does not require a separate light source and is spotlighted as a means for compact device and vivid color display, uses an organic light emitting diode (OLED) for emitting light by itself, and has advantages of a fast response speed, a high contrast ratio, a high luminous efficiency, a high luminance, and a large viewing angle.

With the development of technology, the display device may provide a photographing function and various detection functions in addition to an image display function. Accordingly, the display device is required to include an optical electronic device (also referred to as a light receiving device or a sensor) such as a camera and a detection sensor.

Since the optical electronic device is required to receive light from the front of the display device, the optical electronic device is required to be installed in a place where light reception is advantageous. Accordingly, a camera (a camera lens) and a detection sensor may be exposed on the front surface of the display device. For this reason, there may be formed a through hole or a notch in some display areas of the display panel, and a camera or a detection sensor may be installed in this portion (in other words, in these display areas). The through hole is a light transmission area to transmit light to the camera or the detection sensor.

If through holes are formed in some display areas of the display panel, there may occur a defect phenomenon in which charged charges penetrate into the interior of the display panel. This may be a factor of lowering satisfaction with image quality of the display device.

Accordingly, there have been developed various driving techniques to solve image abnormalities. In addition, in order to improve image quality, operating performance can be improved by controlling the driving conditions of pixels.

SUMMARY

An object of embodiments of the present disclosure is to provide a display device and a display panel capable of improving the brightness phenomenon around a through hole by canceling an excitation current of a pixel circuit due to the charged charges.

In one embodiment, a display panel comprises: a pixel in a display area of the display panel, the pixel including: a light emitting device configured to emit light responsive to a driving current; a driving transistor configured to supply the driving current; and a plurality of switching transistors configured to control the supply of the driving current to the light emitting device by the driving transistor, wherein at least one of the plurality of switching transistors is configured to provide a path to ground through which an excitation current exits within the pixel.

In one embodiment, a display panel comprises: a light emitting device including a first electrode, a light emitting layer, and a second electrode; a driving transistor configured to drive the light emitting device; a bias transistor configured to control a connection between a drain electrode or a source electrode of the driving transistor and an initialization voltage line; and a driving power transistor configured to control an electrical connection between the initialization voltage line and the second electrode of the light emitting device.

In one embodiment, a display device comprises: a display panel including an optical area and a non-optical area, the optical area including a transmissive area and the non-optical area including a light emitting device in a light emitting area of a pixel; and a cover glass on the display panel, wherein the pixel is configured to provide a path to ground through which an excitation current exits within the pixel, the path to ground excluding the light emitting device.

In addition to the technical problems of the present disclosure mentioned above, other features and advantages of the present disclosure may be described below, or will be clearly understood by those skilled in the art from such description.

According to embodiments of the present disclosure, it is possible to improve the brightness phenomenon occurring due to an unintentionally increased amount of current in the pixel adjacent to the through hole, thereby the image quality may be improved.

Effects according to the present disclosure are not limited to the contents exemplified above, and more various effects may be included in the present disclosure.

DETAILED DESCRIPTION

Figure 1A:
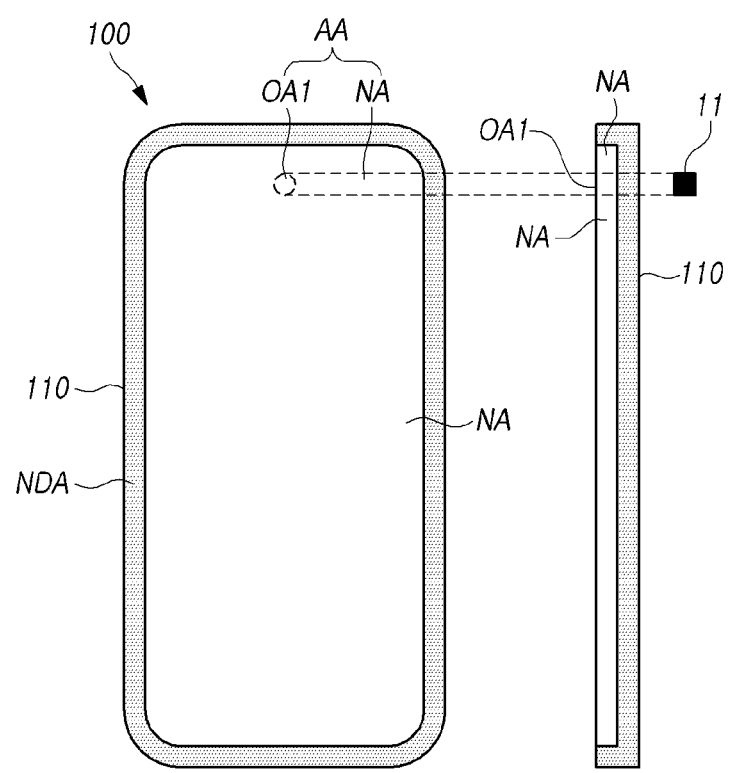
FIGS. 1A, 1B, and 1C are plan views of display devices according to embodiments of the present disclosure.

The advantages and features of the present disclosure and a method for achieving them will become apparent with reference to the embodiments described below in detail in conjunction with the accompanying drawings. However, the present disclosure is not limited to the embodiments disclosed below, but will be implemented in various different forms. The present embodiments are provided to only explain the disclosure of the present specification is complete, and to completely inform those of ordinary skill in the art of this specification the scope of the invention, and the specification will be defined by the scope of the claims.

The shape, size, ratio, angle, number, etc. disclosed in the drawings for explaining the embodiment in the present specification are exemplary and the embodiment of the present specification is not limited to the illustrated matters. In addition, in describing the embodiment, if it is determined that a detailed description of a related known technology may unnecessarily obscure the gist of the embodiment, the detailed description thereof will be omitted.

In the case that the terms of 'include', 'have', 'comprise' etc. are used in this specification, it should be understood as being able to add other parts or elements unless 'only' is used. When an element is expressed in the singular, there may be understood to include cases including the plural unless otherwise explicitly stated.

In addition, in interpreting the elements, it should be interpreted as including an error range even if there is no separate explicit description.

In the description related to spatial relationship, for example, when the positional relationship of two element is described using the terms of "on", "upper", "above", "below", "under", "beneath", "lower", "near", "close", "adjacent", it should be interpreted that one or more elements may be further "interposed" between the elements unless the terms such as "directly", "only" are used.

In the case of a description of a temporal relationship, for example, when a temporal relationship is described as 'after', 'following', 'next', 'then', 'before', it may include cases that are not continuous unless 'immediately' or 'directly' is used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The term "at least one" should be understood to include all possible combinations of one or more related elements. For example, the meaning of "at least one of the first, second, and third elements" may mean all combinations of two or more elements of the first, second and third elements as well as each of the first, second and third element.

The features of each of the embodiments of the present specification may be partially or wholly combined or coupled with each other, and may be various technically linked or operated. In addition, each of the embodiments may be implemented independently of each other or may be implemented together in a related relationship.

Hereinafter, it will be described embodiments of a display device according to the present disclosure with reference to the drawings. In adding reference numerals to components of each drawing, the same components may have the same reference numerals as much as possible even though they are indicated on different drawings. In addition, since the scales of the components shown in the accompanying drawings may have different scales from the actual for convenience of description, the scales shown in the drawings are not limited thereto.

Hereinafter, it will be described embodiments of the present disclosure in detail with reference to the accompanying drawings.

Figure 1B:
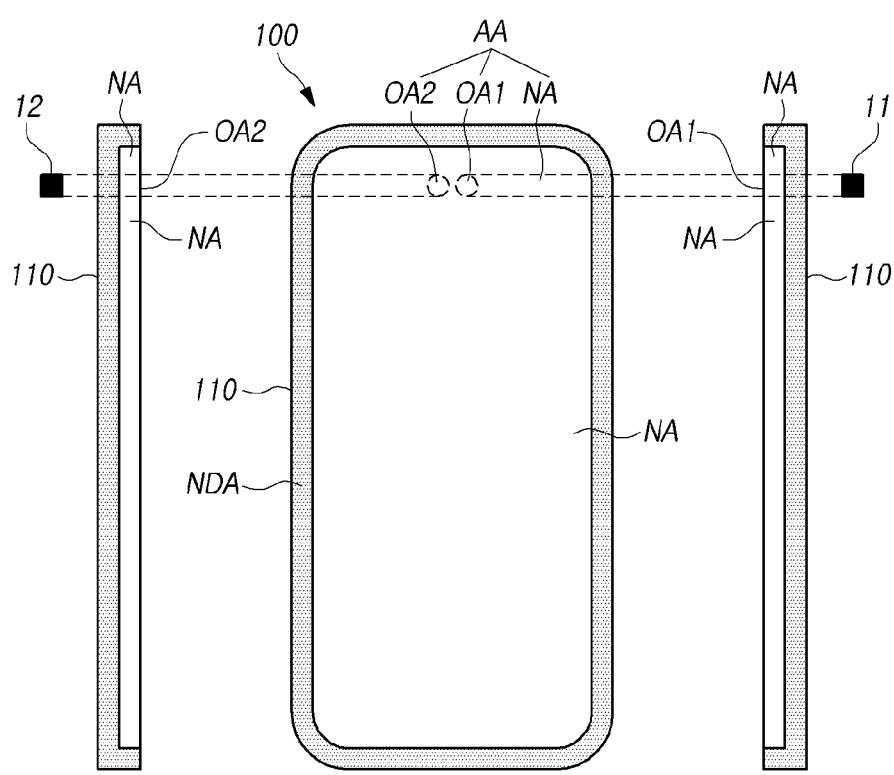
Figure 1C:
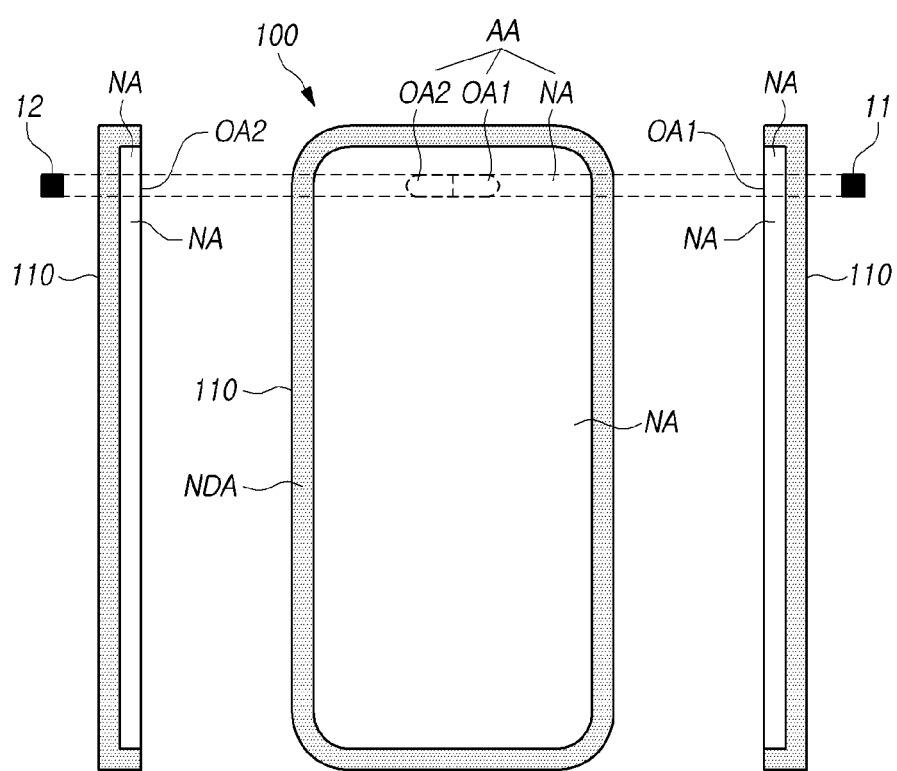

FIGS. 1A, 1B and 1C are plan views of display devices according to embodiments of the present disclosure.

Referring to FIGS. 1A, 1B and 1C, a display device 100 according to the embodiments of the present disclosure may include a display panel 110 for displaying an image and one or more optical electronic devices 11 and 12 (e.g., an optical device).

The display panel 110 may include a display area (or an active area) AA in which an image is displayed and a non-display area (or a non-active area) NDA in which an image is not displayed.

A plurality of sub-pixels may be disposed in the display area AA, and various signal lines for driving the plurality of sub-pixels may be disposed.

The non-display area NDA may be an area outside the display area AA. A plurality of signal lines may be disposed in the non-display area NDA, and a plurality of driving circuits may be connected thereto. The non-display area NDA may be bent to be invisible from the front or may be covered by a case (not shown). The non-display area NDA is also referred to as a bezel or a bezel area.

Referring to FIGS. 1A, 1B and 1C, in the display device 100 according to the embodiments of the present disclosure, one or more optical electronic devices 11 and 12 may be disposed under the display panel 110 (e.g., on an opposite side of a viewing surface).

The one or more optical electronic devices 11 and 12 may be devices which receive light transmitted through the display panel 110 and perform a predetermined function according to the received light. For example, the one or more optical electronic devices 11 and 12 may include one or more of an image capturing device such as a camera (image sensor), and a detection sensor such as a proximity sensor and an illuminance sensor.

Referring to FIGS. 1A, 1B and 1C, the display panel 110 according to embodiments of the present disclosure may include one or more optical areas OA1 and OA2.

Referring to FIGS. 1A, 1B and 1C, one or more optical areas OA1 and OA2 may be an area overlapping one or more of the optical electronic devices 11 and 12. In one embodiment, the optical areas OA1 and the OA2 lacks a transistor.

According to the example of FIG. 1A shown with a combination of a front view and a side view (specially, a right side view), the display area AA may include a first optical area OA1 and a non-optical area NA. The non-optical area NA is an area that does not overlap with one or more optical electronic devices (11) and may also be referred to as a normal area. The non-optical area NA may be positioned to surround the first optical area OA1. Here, at least a portion of the first optical area OA1 may overlap a first optical electronic device 11. Here, the non-optical area NA is also called a normal area.

According to the example of FIG. 1B shown with a combination of a front view, a left side view and a right side view, the display area AA may include the first optical area OA1, a second optical area OA2, and the non-optical area NA. The non-optical area NA may be positioned to surround the first optical area OA1 and the second optical area OA2. In the example of FIG. 1B, the non-optical area NA may exist between the first optical area OA1 and the second optical area OA2. Here, at least a portion of the first optical area OA1 may overlap a first optical electronic device 11, and at least a portion of the second optical area OA2 may overlap a second optical electronic device 12.

According to the example of FIG. 1C shown with a combination of a front view, a left side view and a right side view, the display area AA may include the first optical area OA1, the second optical area OA2, and the non-optical area NA. The non-optical area NA may be positioned to surround the first optical area OA1 and the second optical area OA2. In the example of FIG. 1C, the non-optical area NA may not exist between the first optical area OA1 and the second optical area OA2. That is, the first optical area OA1 and the second optical area OA2 are in contact with each other. Here, at least a portion of the first optical area OA1 may overlap the first optical electronic device 11, and at least a portion of the second optical area OA2 may overlap the second optical electronic device 12.

At least one optical area, that is, the first optical area OA1 and/or the second optical area OA2 are required to include a light transmittance structure. A light transmittance structure for transmitting light to one or more optical electronic devices 11 and 12 is required to be formed in one or more optical areas OA1 and OA2.

The one or more optical electronic devices 11 and 12 are devices which require light reception, but are positioned behind the display panel 110 (below, opposite to the viewing surface) to receive light transmitted through the display panel 110.

One or more optical electronic devices 11 and 12 may be exposed on the front surface (viewing surface) of the display panel 110.

For example, the first optical electronic device 11 may be a camera, and the second optical electronic device 12 may be a detection sensor such as a proximity sensor or a luminance sensor. For example, the detection sensor may be an infrared sensor for detecting infrared rays.

Conversely, the first optical electronic device 11 may be a detection sensor, and the second optical electronic device 12 may be a camera.

Hereinafter, for convenience of description, it is assumed that the first optical electronic device 11 is a camera and the second electronic device 12 is a detection sensor. Here, the camera may be a camera lens or an image sensor.

In the case that the first optical electronic device 11 is a camera, the camera is located behind (below) the display panel 110, but may be a front camera for photographing the front direction of the display panel 110. Accordingly, the user may take a picture through the camera while looking at the viewing surface of the display panel 110.

The first optical area OA1 may have various shapes, such as a circle, an ellipse, a square, a hexagon, or an octagon. The second optical area OA2 may have various shapes, such as a circle, an ellipse, a square, a hexagon, or an octagon. The first optical area OA1 and the second optical area OA2 may have the same shape or different shapes.

Referring to FIG. 1C, in the case that the first optical area OA1 and the second optical area OA2 are in contact with each other, the entire optical area including the first optical area OA1 and the second optical area OA2 may also have various shapes such as a circle, an ellipse, a square, a hexagon or an octagon.

Hereinafter, for convenience of explanation, each of the first optical area OA1 and the second optical area OA2 is exemplified in a circular shape.

In the display device 100 according to the embodiments of the present disclosure, if the optical areas OA1 and OA2 are surrounded by the display area AA, the display device 100 according to the embodiments of the present disclosure may be referred to a display with a hole-in-active area (HIAA) technology.

Accordingly, in the display device 100 according to the embodiments of the present disclosure, a notch for camera exposure may not be formed in the display panel 110. The display device 100 according to the embodiments of the present disclosure may have a camera hole for camera exposure.

Since there is no need to form a notch in the display panel 110, the size of the bezel area may be reduced, design restrictions may be reduced, so that the degree of freedom in design may be increased.

Figure 2:
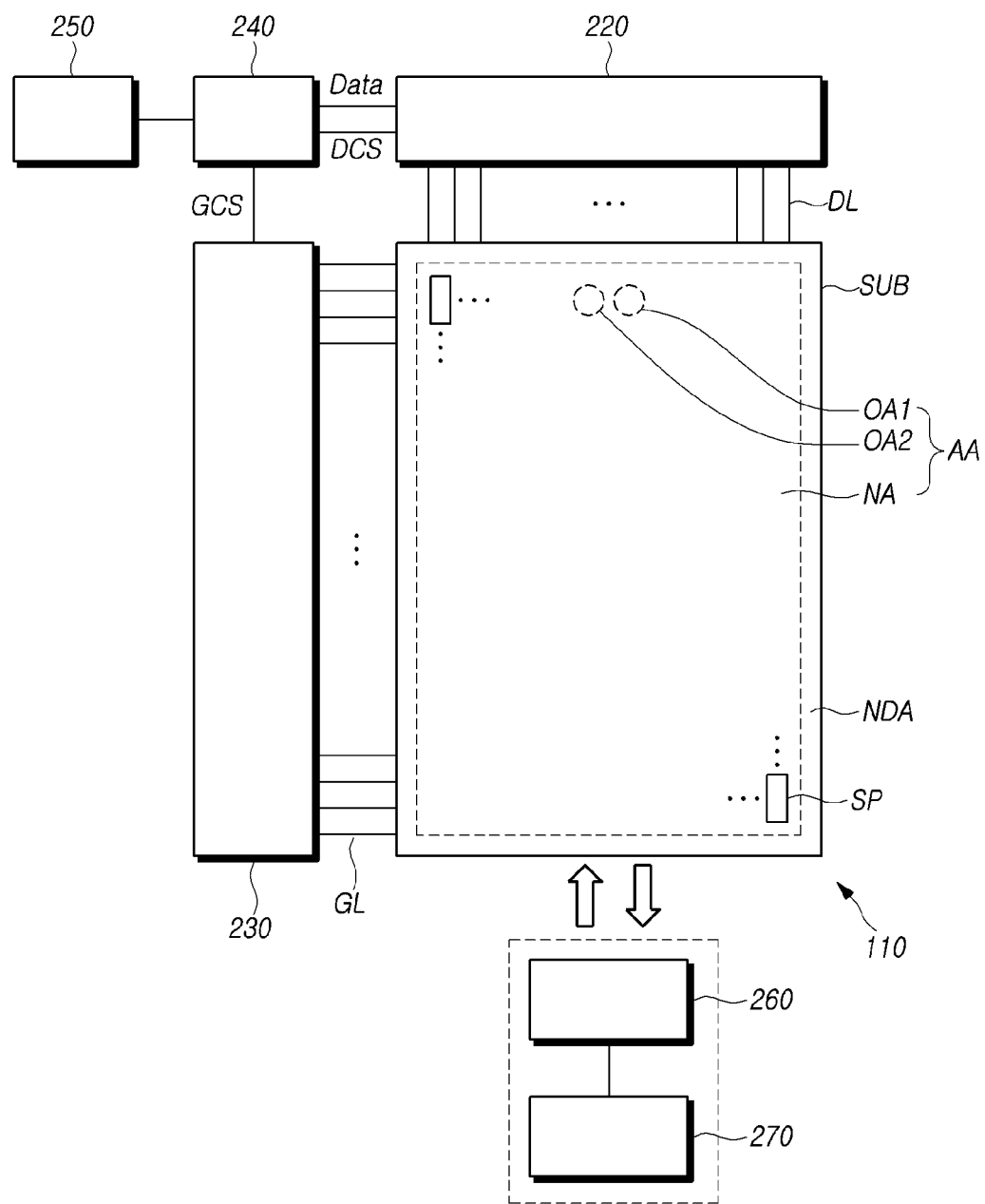
FIG. 2 is a system configuration diagram of a display device according to embodiments of the present disclosure.

FIG. 2 is a system configuration diagram of a display device according to embodiments of the present disclosure.

Referring to FIG. 2, the display device 100 may include a display panel 110 and a display driving circuit as components for displaying an image.

The display driving circuit is a circuit for driving the display panel 110 and may include a data driving circuit 220, a gate driving circuit 230, a display controller 240, and the like.

The display panel 110 may include a display area (or an active area) AA in which an image is displayed and a non-display area (or a non-active area) NA in which an image is not displayed. The non-display area NDA may be an area outside the display area AA, and may also be referred to as a bezel area. All or part of the non-display area NDA may be an area visible from the front side of the display device 100, or an area which is bent and not visible from the front side of the display device 100.

The display panel 110 may include a substrate SUB and a plurality of sub-pixels SP disposed on the substrate SUB. In addition, the display panel 110 may further include various types of signal lines to drive the plurality of sub-pixels SP.

The display device 100 according to the embodiments of the present disclosure may be a liquid crystal display device or the like, or a self-luminous display device in which the display panel 110 emits light by itself. In the case that the display device 100 according to the embodiments of the present disclosure is a self-luminous display device, each of the plurality of sub-pixels SP may include a light emitting device.

For example, the display device 100 according to the embodiments of the present disclosure may be an organic light emitting diode (OLED) display device in which the light emitting device is implemented as an organic light emitting diode (OLED). For another example, the display device 100 according to the embodiments of the present disclosure may be an inorganic light emitting display device in which the light emitting device is implemented as an inorganic material-based light emitting diode. As another example, the display device 100 according to the embodiments of the present disclosure may be a quantum dot display device implemented with quantum dots as the light emitting device, which are semiconductor crystals emitting light by itself.

The structure of each of the plurality of sub-pixels SP may vary according to the type of the display device 100. For example, if the display device 100 is a self-luminous display device in which the sub-pixels SP emit light by themselves, each sub-pixel SP includes a light-emitting device for emitting light, one or more transistors, and one or more capacitors.

For example, various types of signal lines may include a plurality of data lines DL transferring data signals (also referred to as data voltages or image signals) and a plurality of gate lines GL for transferring gate signals (also referred to as scan signals).

The plurality of data lines DL and the plurality of gate lines GL may cross each other. Each of the plurality of data lines DL may be disposed to extend in a first direction. Each of the plurality of gate lines GL may be disposed to extend in a second direction that is different from the first direction.

Here, the first direction may be a column direction, and the second direction may be a row direction. Alternatively, the first direction may be a row direction and the second direction may be a column direction.

The data driving circuit 220 is a circuit for driving the plurality of data lines DL, and may output data signals to the plurality of data lines DL. The gate driving circuit 230 is a circuit for driving the plurality of gate lines GL, and may output gate signals to the plurality of gate lines GL.

The display controller 240 is a device for controlling the data driving circuit 220 and the gate driving circuit 230, and may control driving timings for the plurality of data lines DL and driving timings for the plurality of gate lines GL.

The display controller 240 may supply a data driving control signal DCS to the data driving circuit 220 to control the data driving circuit 220, and may supply a gate driving control signal GCS to the gate driving circuit 230 to control the gate driving circuit 230.

The display controller 240 may receive input image data from a host system 250 and supply the image data to the data driving circuit 220 based on the input image data.

The data driving circuit 220 may supply data signals to the plurality of data lines DL according to the driving timing control of the display controller 240.

The data driving circuit 220 may receive digital image data from the display controller 240, and may convert the received image data into analog data signals to output the converted signals to the plurality of data lines DL.

The gate driving circuit 230 may supply gate signals to the plurality of gate lines GL according to the timing control of the display controller 240. The gate driving circuit 230 may receive a first gate voltage corresponding to a turn-on level voltage and a second gate voltage corresponding to a turn-off level voltage along with various gate driving control signals GCS to generate gate signals, and may supply the generated gate signals to the plurality of gate lines GL.

For example, the data driving circuit 220 may be connected to the display panel 110 by a tape automated bonding (TAB) method, or may be connected to a bonding pad of the display panel 110 by a chip-on-glass (COG) method or a chip-on-panel (COP) method, or may be implemented in a chip-on-film (COF) method to be connected to the display panel 110.

The gate driving circuit 230 may be connected to the display panel 110 by a tape automated bonding (TAB) method, or may be connected to a bonding pad of the display panel 110 by a chip-on-glass (COG) method or a chip-on-panel (COP) method, or may be implemented in a chip-on-film (COF) method to be connected to the display panel 110. Alternatively, the gate driving circuit 230 may be formed in the non-display area NDA of the display panel 110 in a gate-in-panel (GIP) type. The gate driving circuit 230 may be disposed on the substrate SUB or may be connected to the substrate SUB. That is, in the case of the GIP type, the gate driving circuit 230 may be disposed in the non-display area NDA of the substrate SUB. The gate driving circuit 230 may be connected to the substrate SUB in the case of a chip-on-glass (COG) type, a chip-on-film (COF) type, or the like.

Meanwhile, at least one of the data driving circuit 220 and the gate driving circuit 230 may be disposed in the display area AA of the display panel 110. For example, at least one driving circuit of the data driving circuit 220 and the gate driving circuit 230 may be disposed not to overlap the sub-pixels SP, and may be disposed to partially or entirely overlap the sub-pixels SP.

The data driving circuit 220 may be connected to one side (e.g., an upper side or a lower side) of the display panel 110. Depending on the driving method, the panel design method, etc., the data driving circuit 220 may be connected to both sides (e.g., the upper side and the lower side) of the display panel 110 or may be connected to two or more of the four sides of the display panel 110.

The gate driving circuit 230 may be connected to one side (e.g., a left side or a right side) of the display panel 110. Depending on the driving method, the panel design method, etc., the gate driving circuit 230 may be connected to both sides (e.g., the left side and the right side) of the display panel 110, or may be connected to at least two of the four sides of the display panel 110.

The display controller 240 may be implemented as a component separate from the data driving circuit 220, or may be integrated with the data driving circuit 220 and implemented as an integrated circuit.

The display controller 240 may be a timing controller used in a conventional display technology, or a control device capable of further performing other control functions including the timing controller, or a control device different from the timing controller, or a circuit in a control device. The display controller 240 may be implemented with various circuits or electronic components, such as an integrated circuit (IC), a field programmable gate array (FPGA), an application specific integrated circuit (ASIC), or a processor.

The display controller 240 may be mounted on a printed circuit board, a flexible printed circuit, or the like, and may be electrically connected to the data driving circuit 220 and the gate driving circuit 230 through the printed circuit board, the flexible printed circuit, or the like.

The display controller 240 may transmit and receive signals to and from the data driving circuit 220 according to one or more predetermined interfaces. Here, for example, the interface may include a low voltage differential signaling (LVDS) interface, an EPI interface, and a serial peripheral interface (SPI).

In order to provide a touch sensing function as well as an image display function, the display device 100 according to the embodiments of the present disclosure may include a touch sensor and a touch sensing circuit for detecting whether a touch is occurred by a touch object such as a finger or a pen by sensing the touch sensor or detecting a touch position.

The touch sensing circuit may include a touch driving circuit 260 which drives and senses a touch sensor to generate and output touch sensing data, and a touch controller 270 capable of detecting a touch occurrence or detecting a touch position using the touch sensing data.

The touch sensor may include a plurality of touch electrodes. The touch sensor may further include a plurality of touch lines for electrically connecting the plurality of touch electrodes and the touch driving circuit 260.

The touch sensor may exist outside the display panel 110 in the form of a touch panel, or may exist inside the display panel 110. In the case that the touch sensor exists outside the display panel 110 in the form of a touch panel, the touch sensor may be referred to as a touch sensor of an external type. If the touch sensor is a touch sensor of an external type, the touch panel and the display panel 110 may be separately manufactured and combined during an assembly process. A touch panel of an external type may include a touch panel substrate and a plurality of touch electrodes on the touch panel substrate.

If the touch sensor exists inside the display panel 110, the touch sensor may be formed on the substrate SUB together with signal lines and electrodes related to the display driving during the manufacturing process of the display panel 110.

The touch driving circuit 260 may supply a touch driving signal to at least one of the plurality of touch electrodes and sense at least one of the plurality of touch electrodes to generate touch sensing data.

The touch sensing circuit may perform touch sensing using a self-capacitance sensing method or a mutual-capacitance sensing method.

In the case that the touch sensing circuit performs touch sensing in a self-capacitance sensing method, the touch sensing circuit may perform touch sensing based on capacitance between each touch electrode and a touch object (e.g., finger, pen, etc.).

According to the self-capacitance sensing method, each of the plurality of touch electrodes may serve as both a driving touch electrode and a sensing touch electrode. The touch driving circuit 260 may drive all or part of the plurality of touch electrodes and sense all or part of the plurality of touch electrodes.

In the case that the touch sensing circuit performs touch sensing in a mutual-capacitance sensing method, the touch sensing circuit may perform touch sensing based on capacitance between touch electrodes.

According to the mutual-capacitance sensing method, the plurality of touch electrodes may be divided into driving touch electrodes and sensing touch electrodes. The touch driving circuit 260 may drive the driving touch electrodes and sense the sensing touch electrodes.

The touch driving circuit 260 and the touch controller 270 included in the touch sensing circuit may be implemented as separate devices or as a single device. In addition, the touch driving circuit 260 and the data driving circuit 220 may be implemented as separate devices or as a single device.

The display device 100 may further include a power supply circuit for supplying various types of power to the display driving circuit and/or the touch sensing circuit.

The display device 100 according to the embodiments of the present disclosure may be a mobile terminal such as a smart phone or a tablet, or a monitor or television of various sizes, but is not limited thereto, and may be a display of various types and various sizes capable of displaying information or an image.

Figure 3:
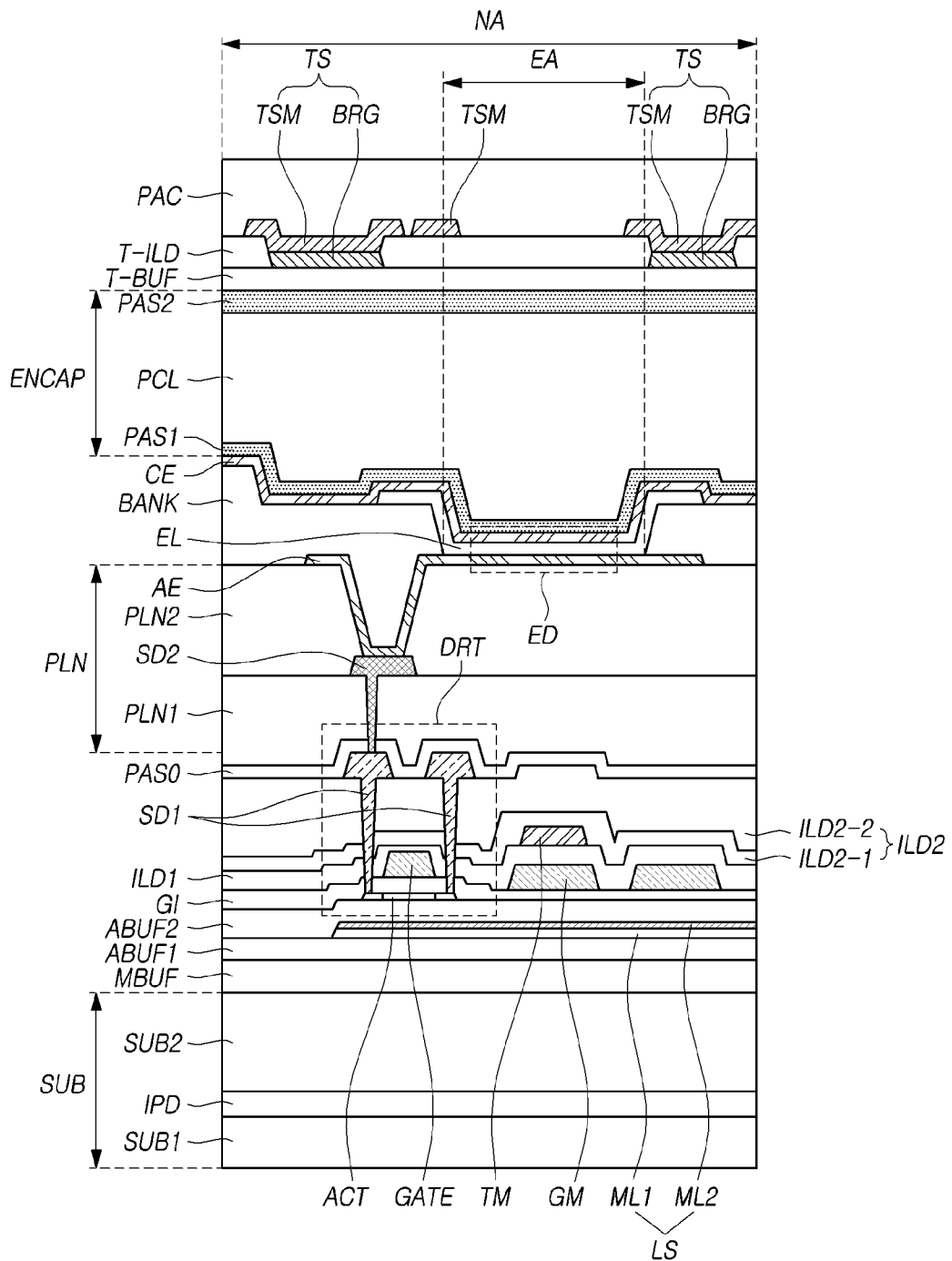
FIG. 3 is a cross-sectional view of a display area of a display panel in a display device according to embodiments of the present disclosure.

FIG. 3 is a cross-sectional view of a display area of a display panel in a display device according to embodiments of the present disclosure.

Referring to FIG. 3, a substrate SUB may include a first substrate SUB1, an interlayer insulating layer IPD, and a second substrate SUB2. The interlayer insulating layer IPD may be positioned between the first substrate SUB1 and the second substrate SUB2. The substrate SUB is configured to include the first substrate SUB1, the interlayer insulating layer IPD and the second substrate SUB2, so that it is possible to prevent or at least reduce the penetration of moisture. For example, the first substrate SUB1 and the second substrate SUB2 may be polyimide (PI) substrates. The first substrate SUB1 may be referred to as a primary PI substrate, and the second substrate SUB2 may be referred to as a secondary PI substrate.

Referring to FIG. 3, on the substrate SUB, there may be disposed various patterns (ACT, SD1 and GATE), various insulating layers (MBUF, ABUF1, ABUF2, GI, ILD1, ILD2 and PAS0), and various metal patterns (TM, GM, ML1 and ML2).

Referring to FIG. 3, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. Here, the first metal layer ML1 and the second metal layer ML2 may be a light shield layer LS for shielding light.

A second active buffer layer ABUF2 may be disposed on the first metal layer ML1 and the second metal layer ML2. An active layer ACT of a driving transistor DRT may be disposed on the second active buffer layer ABUF2.

A gate insulating layer GI may be disposed on the second active buffer layer ABUF2 while covering the active layer ACT.

A gate electrode GATE of the driving transistor DRT may be disposed on the gate insulating layer GI. In this case, a gate material layer GM may be disposed on the gate insulating layer GI together with the gate electrode GATE of the driving transistor DRT at a position different from the formation position of the driving transistor DRT.

A first interlayer insulating layer ILD1 may be disposed on the gate insulating layer GI while covering the gate electrode GATE and the gate material layer GM. A metal pattern TM may be disposed on the first interlayer insulating layer ILD1. The metal pattern TM may be located at a location different from the formation location of the driving transistor DRT. A second interlayer insulating layer ILD2 may be disposed on the first interlayer insulating layer ILD1 while covering the metal pattern TM.

Two first source-drain electrode patterns SD1 may be disposed on the second interlayer insulating layer ILD2. One of the two first source-drain electrode patterns SD1 is a source node of the driving transistor DRT, and the other of the two first source-drain electrode patterns SD1 is a drain node of the driving transistor DRT.

The two first source-drain electrode patterns SD1 may be electrically connected to a first side and a second side of the active layer ACT through contact holes of the second interlayer insulating layer ILD2, the first interlayer insulating layer ILD1 and the gate insulating layer GI.

Meanwhile, referring to FIG. 3, the second interlayer insulating layer ILD2 may include a second-1 interlayer insulating layer ILD2-1 and a second-2 interlayer insulating layer ILD2-2. The second-1 interlayer insulating layer ILD2-1 may be positioned on the first interlayer insulating layer ILD1 while covering the metal pattern TM. The second-2 interlayer insulating layer ILD2-2 may be disposed on the second-1 interlayer insulating layer ILD2-1.

A portion of the active layer ACT overlapping the gate electrode GATE is a channel region. One of the two first source-drain electrode patterns SD1 may be connected to one side of the channel region in the active layer ACT, and the other one of the two first source-drain electrode patterns SD1 may be connected to the other side of the channel region in the active layer ACT.

A passivation layer PAS0 may be disposed on the second-2 interlayer insulating layer ILD2-2 while covering the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (e.g., the second node N2 of the driving transistor DRT in the sub-pixel SP of FIG. 3) through a contact hole of the first planarization layer PLN1.

The second planarization layer PLN2 may be disposed on the first planarization layer PLN1 while covering the second source-drain electrode pattern SD2. A light emitting device ED may be disposed on the second planarization layer PLN2.

In a stacked structure of the light emitting device ED, an anode electrode AE may be disposed on the second planarization layer PLN2. The anode electrode AE may be electrically connected to the second source-drain electrode pattern SD2 through a contact hole of the second planarization layer PLN2.

A bank BANK may be disposed on the second planarization layer PLN2 while covering a portion of the anode electrode AE. A portion of the bank BANK corresponding to the light emitting area EA of the sub-pixel SP may be opened.

A portion of the anode electrode AE may be exposed through an opening (open portion) of the bank BANK. A light emitting layer EL may be positioned on a side surface of the bank BANK and the opening (open portion) of the bank BANK. All or part of the light emitting layer EL may be positioned between adjacent banks.

In the opening of the bank BANK, the light emitting layer EL may contact the anode electrode AE. A cathode electrode CE may be disposed on the light emitting layer EL.

The light emitting device ED may be formed by the anode electrode AE, the light emitting layer EL, and the cathode electrode CE. The light emitting layer EL may include an organic layer.

An encapsulation layer ENCAP may be disposed on the above-described light emitting device ED.

The encapsulation layer ENCAP may have a single-layer structure or a multi-layer structure. For example, as shown in FIG. 3, the encapsulation layer ENCAP may include a first encapsulation layer PAS1, a second encapsulation layer PCL, and a third encapsulation layer PAS2.

For example, each of the first encapsulation layer PAS1 and the third encapsulation layer PAS2 may be an inorganic layer, and the second encapsulation layer PCL may be an organic layer. The second encapsulation layer PCL may be the thickest among the first encapsulation layer PAS1, the second encapsulation layer PCL and the third encapsulation layer PAS2. Accordingly, the second encapsulation layer PCL may serve as a planarization layer. The first encapsulation layer PAS1 may be also referred to as a first inorganic encapsulation layer, the second encapsulation layer PCL may be also referred to as an organic encapsulation layer, and the third encapsulation layer PAS2 may be also referred to as a second inorganic encapsulation layer.

The first encapsulation layer PAS1 may be disposed on the cathode electrode CE and may be disposed closest to the light emitting device ED. The first encapsulation layer PAS1 may be formed of an inorganic insulating material capable of low-temperature deposition. For example, the first encapsulation layer PAS1 may be made of silicon nitride (SiNx), silicon oxide (SiOx), silicon oxynitride (SiON), or aluminum oxide ($Al_2O_3$). Since the first encapsulation layer PAS1 is deposited in a low temperature atmosphere, during the deposition process, the first encapsulation layer PAS1 may prevent the light emitting layer EL including an organic material vulnerable to a high temperature atmosphere from being damaged.

The second encapsulation layer PCL may have a smaller area than the first encapsulation layer PAS1. In this case, the second encapsulation layer PCL may be formed to expose both ends of the first encapsulation layer PAS1. The second encapsulation layer PCL may serve as a buffer for relieving stress between layers due to bending of the display device 100, and may also serve to enhance planarization performance. For example, the second encapsulation layer PCL may be made of acrylic resin, epoxy resin, polyimide, polyethylene, silicon oxycarbon (SiOC), or the like, and may be formed of an organic insulating material. For example, the second encapsulation layer PCL may be formed through an inkjet method.

The third encapsulation layer PAS2 may be formed on the substrate SUB on which the second encapsulation layer PCL is formed so as to cover the upper surface and side surfaces of the second encapsulation layer PCL and the first encapsulation layer PAS1, respectively. The third encapsulation layer PAS2 may reduce or block external moisture or oxygen from penetrating into the first encapsulation layer PAS1 and the second encapsulation layer PCL. For example, the third encapsulation layer PAS2 may be formed of an inorganic insulating material such as silicon nitride (SiNx), silicon oxide (SiOx), silicon oxynitride (SiON), or aluminum oxide ($Al_2O_3$).

Referring to FIG. 3, if the touch sensor TS is of a type that is embedded in the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and bridge metals BRG positioned on different layers.

A touch interlayer insulating layer T-ILD may be disposed between the touch sensor metals TSM and the bridge metals BRG.

For example, the touch sensor TS include a first touch electrode and a second touch electrode. The first touch electrode and the second touch electrode may be formed of a touch sensor metal TSM. The first touch electrode and the second touch electrode may be electrically connected through the bridge metal BRG positioned on a different layer from the touch sensor metal TSM.

When the touch sensor TS is formed on the display panel 110, a chemical solution (developer or etchant, etc.) used in the manufacturing process thereof or moisture may be generated from the outside. The touch sensor TS is disposed on the touch buffer layer T-BUF, so that it is possible to prevent or at least reduce a chemical solution or moisture from penetrating into the light emitting layer EL including an organic material during a manufacturing process of the touch sensor TS. Accordingly, the touch buffer layer T-BUF may prevent damage to the light emitting layer EL, which is vulnerable to a chemical solution or moisture.

The touch buffer layer T-BUF may be formed at a low temperature below a certain temperature (e.g., 100 degrees (° C.)) to prevent or at least reduce damage to the light emitting layer EL containing organic materials which are vulnerable to high temperatures, and may be formed of an organic insulating material having a low dielectric constant of 1 to 3. For example, the touch buffer layer T-BUF may be formed of an acrylic-based, epoxy-based, or silicon-based material. When the display device 100 is bent or folded, the encapsulation layer ENCAP may be damaged, and the touch sensor metal positioned on the touch buffer layer T-BUF may be broken. Even when the display device 100 is bent, the touch buffer layer T-BUF made of an organic insulating material and having planarization performance may prevent damage to the encapsulation layer ENCAP and/or breakage of the touch sensor metals TSM and the bridge metal BRG constituting the touch sensor TS.

The passivation layer PAC may be disposed on the touch interlayer insulating layer T-ILD while covering the touch sensor TS. The passivation layer PAC may be an organic insulating layer.

Figure 4:
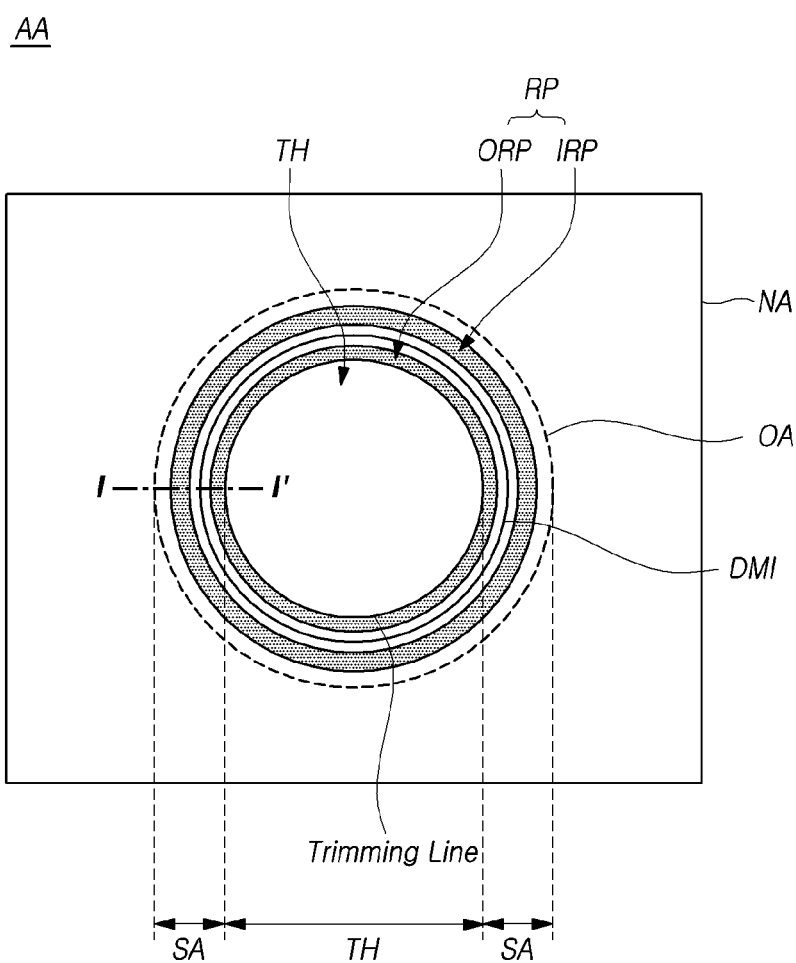
FIG. 4 is an enlarged plan view illustrating an optical area structure of a display panel in a display device according to embodiments of the present disclosure.

FIG. 4 is an enlarged plan view illustrating an optical area structure of a display panel in a display device according to embodiments of the present disclosure.

Referring to FIG. 4, an optical area OA is disposed in the display area AA. Pixels (not shown) may be disposed around the optical area OA. The optical area OA may be any one of the first optical area OA1 and the second optical area OA2 described above.

Referring to FIG. 4, the optical area OA may include a through hole TH and a surrounding area SA around the through hole TH. A rough pattern RP may be located in the surrounding area SA around the through hole TH. A sub-pixel for displaying an image may not be located in the optical area OA. In one embodiment, the through hole TH is a light transmission area that transmits external light to a camera or sensor that overlaps the optical area OA.

The through hole TH may be formed by removing the substrate along a trimming line. The shape of the through hole TH may be circular as shown in FIG. 4, but may have various shapes such as an ellipse, a square, a hexagon, or an octagon.

The rough pattern RP may include an inner (or inner side) rough pattern IRP (e.g., a first rough pattern) and an outer (or outer side) rough pattern ORP (e.g., a second rough pattern). The inner rough pattern IRP are first protrusions and the outer rough patterns ORP are second protrusions in one embodiment.

Referring to FIG. 4, in the surrounding area SA, there may be located an inner dam DMI for separating the above-described two patterns (that is, the inner rough pattern IRP and the outer rough pattern ORP) between the inner rough pattern IRP and the outer rough pattern ORP.

There may be further positioned an outer dam (not shown) disposed in the display area AA outside the inner rough pattern IRP. The outer dam may be disposed to prevent a second encapsulation layer PCL from overflowing the display area AA.

The shape of the inner dam DMI corresponds to the shape of the through hole TH and has a closed curve shape surrounding the through hole TH. The inner dam DMI and the through hole TH may have different closed curve shapes, but may have a closed curve with the same shape but different sizes. For example, the inner dam DMI and the through hole TH may have a concentric circle shape, and may be disposed to be spaced apart from each other by a predetermined interval.

The rough pattern RP has a closed curve shape surrounding the through hole TH while corresponding to the shape of the through hole TH. The rough pattern RP may have a closed curve shape different from that of the through hole TH, but may have a closed curve shape having the same shape but having different sizes. For example, as shown in FIG. 4, the rough pattern RP and the through-hole TH may have the same shape, and may be spaced apart from each other by a predetermined interval. In one embodiment, the outer rough pattern ORP surrounds the through hole TH and the inner rough pattern IRP surrounds the outer rough pattern ORP and the through hole TH.

Meanwhile, a sub-pixel disposed in the display area AA may include a light emitting device. In the case that the light emitting device is an organic light emitting device, a light emitting layer (not shown) may be positioned in the display area AA, and the light emitting layer may be an organic light emitting layer including an organic material.

The organic light emitting layer may be disposed up to at least a partial area of the optical area OA.

Meanwhile, when moisture penetrates into the organic light emitting layer, there may occur a defect phenomenon such as darkening of the sub-pixel. There may be a possibility that moisture penetrates in the region where the through hole TH is located.

The above-described inorganic encapsulation layer (e.g., PAS1) may be positioned on the rough pattern RP. Moisture can penetrate through the inorganic encapsulation layer, and the rough pattern RP may have an effect of lengthening the path through which moisture permeates in the inorganic encapsulation layer. Accordingly, the rough pattern RP may prevent or at least reduce moisture introduced from the through hole TH from reaching the light emitting layer positioned in the display area AA.

Figure 5:
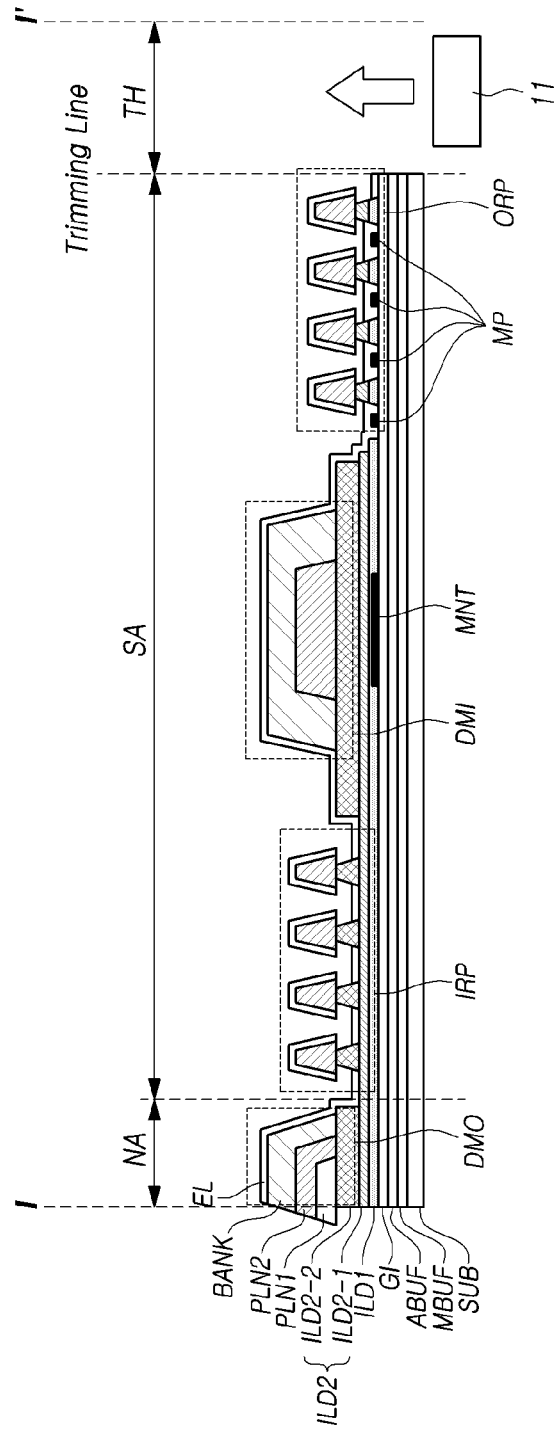
FIG. 5 is a cross-sectional view along line I-I' in the optical area of FIG. 4 according to embodiments of the present disclosure.

FIG. 5 is a cross-sectional view along line I-I' in the optical area of FIG. 4 according to one embodiment.

Referring to FIG. 5, the optical area OA includes the through hole TH and the surrounding area SA, and the display area AA may be located outside the surrounding area SA.

An optical electronic device positioned under the display panel and positioned to overlap the through hole TH with at least a partial region may be positioned in the through hole TH. Such an optical electronic device may be the above-described first optical electronic device 11.

Referring to FIG. 5, the display device according to embodiments of the present disclosure may include "dam structures" such as an outer dam DMO positioned in the display area AA and an inner dam DMI positioned in the surrounding area SA. The dam structure may have a triple-layer structure formed perpendicular to the substrate SUB. For example, the dam structure may include a first layer formed of a planarization layer PLN, a second layer formed of a bank BANK, and a third layer formed of a spacer (not shown).

Referring to FIG. 5, the above-described first planarization layer PLN1 and second planarization layer PLN2 are briefly illustrated as a planarization layer PLN. In such a dam structure, at least a portion of the light emitting layer EL may be disposed on the spacer.

Some components constituting the light emitting device may be stacked on the inner dam DMI. For example, the light emitting layer EL and the common electrode (not shown) may be stacked in a shape climbing over the inner dam DMI. That is, the light emitting layer EL is on the inner dam DMI.

The rough patterns RP are located on the inside (e.g., a first side) and outside (e.g., a second side) of the inner dams DMI. The rough pattern RP may include a mountain (e.g., a protrusion) including an insulating layer (e.g., ILD1, ILD2-1, ILD2-2, etc.) and a valley from which at least a portion of the insulating layer is removed.

The light emitting layer EL may be positioned in at least a portion of the rough pattern RP. The light emitting layer EL may be an organic light emitting layer including an organic material. The light emitting layer EL may extend from the display area AA to at least a partial area of the surrounding area SA.

Referring to FIG. 5, the light emitting layer EL may be discontinuously positioned in the inner rough pattern IRP and the outer rough pattern ORP. That is, a portion of the light emitting layer EL in the surrounding area SA extends discontinuously on the inner rough pattern IRP and the outer rough pattern ORP such that there are breaks in the light emitting layer EL. Accordingly, even if the moisture introduced from the through hole TH reaches into the light emitting layer EL positioned in the surrounding area SA, the moisture does not penetrate to the light emitting layer EL positioned in the display area AA. That is, since the light emitting layer EL is discontinuously disposed in the rough pattern RP, there may provide an effect of preventing or at least reducing moisture flowing into the light emitting layer EL from being diffused to the display area AA in addition to an effect of lengthening the moisture permeation path.

Meanwhile, referring to FIG. 5, the height of a mountain may be different from each other in the inner rough pattern IRP and the outer rough pattern ORP. A height of a mountain in the inner rough pattern IRP may be greater than a height of a mountain in the outer rough pattern ORP.

The reason why the height of the mountain is different in the inner rough pattern IRP and the outer rough pattern ORP may be due the fact that the interlayer insulating layer (e.g., ILD1, ILD2-1, ILD2-2) included in the mountain is different.

For example, referring to FIG. 5, a mountain of the inner rough pattern IRP may include a second-2 interlayer insulating layer ILD2-2, but may not include a second-1 interlayer insulating layer ILD2-1 and a first interlayer insulating layer ILD1. A mountain of the outer rough pattern ORP may include the second-1 interlayer insulating layer ILD2-1 and the first interlayer insulating layer ILD1, but may not include the second-2 interlayer insulating layer ILD2-2.

Meanwhile, referring to FIG. 5, a bottom surface of the valley located in the outer rough pattern ORP may be located lower than a bottom surface of the valley located in the inner rough pattern IRP.

For example, a valley in the outer rough pattern ORP may be formed by removing at least a portion of the first interlayer insulating layer ILD1 and the second interlayer insulating layer ILD2 (e.g., the second-1 interlayer insulating layer ILD2-1).

Referring to FIG. 5, in the process of removing the first interlayer insulating layer ILD1 from the outer rough pattern ORP to form the valley of the rough pattern RP, there is a risk that a gate insulating layer GI may be damaged or an insulating layer (e.g., ABUF, MBUF, etc.) positioned below the gate insulating layer GI may be damaged.

Accordingly, a metal pattern MP may be located in the valley located in the outer rough pattern ORP. Each metal pattern may be located in a valley between two mountains in the outer rough pattern ORP.

Referring to FIG. 5, for example, the metal pattern MP may be disposed in the surrounding area SA to have the same shape as that of a valley positioned in the outer rough pattern ORP. The metal pattern MP positioned to correspond to the valley of the rough pattern RP may function as an "etching stopper".

Alternatively, the metal pattern MP may be positioned to overlap a mountain positioned in the outer rough pattern ORP. That is, the metal pattern MP may be widely positioned under the outer rough pattern ORP. In this case, the metal pattern MP may also perform a function of preventing micro cracks generated in the through hole TH from spreading to the display area AA. In this case, the metal pattern MP may function not only as an etching stopper but also as a crack stopper.

The metal pattern MP may be positioned on the gate insulating layer GI. The metal pattern MP may be formed of the same material as the gate electrode GATE of the driving transistor DRT of FIG. 3 described above.

The metal pattern MP may be made of a material different from the insulating layer (e.g., the gate insulating layer GI, the first interlayer insulating layer ILD1) above and below the metal pattern MP. Accordingly, even if the insulating layer (e.g., the first interlayer insulating layer ILD1) covering the metal pattern MP is removed in a process such as etching, the insulating layer (e.g., the gate insulating layer GI) under the metal pattern MP may be protected.

Meanwhile, an align mark MNT may be located in the surrounding area SA. The align mark MNT may be also referred to as an "align key". The align mark MNT may be disposed on the substrate SUB to form a through hole TH by etching a preset area in the substrate SUB.

The align mark MNT may be disposed in a shape corresponding to the shape of the through hole TH in the surrounding area SA, or may be disposed in a shape different from that of the through hole TH. The align mark MINT, for example, may be located only in some areas of the top, bottom, left, and right of the through hole TH.

Meanwhile, the align mark MINT may be located on the same layer as the metal pattern MP. For example, the align mark MNT may be formed of the same material as the gate electrode GATE. The align mark MNT may be positioned on the gate insulating layer GI. The align mark MNT may be positioned on the gate insulating layer GI while being covered by the first interlayer insulating layer ILD1.

The align mark MNT, for example, may be located in an area overlapping the inner dam DMI. The align mark MNT, for example, may be located between the inner rough pattern IRP and the outer rough pattern ORP.

Figure 6:
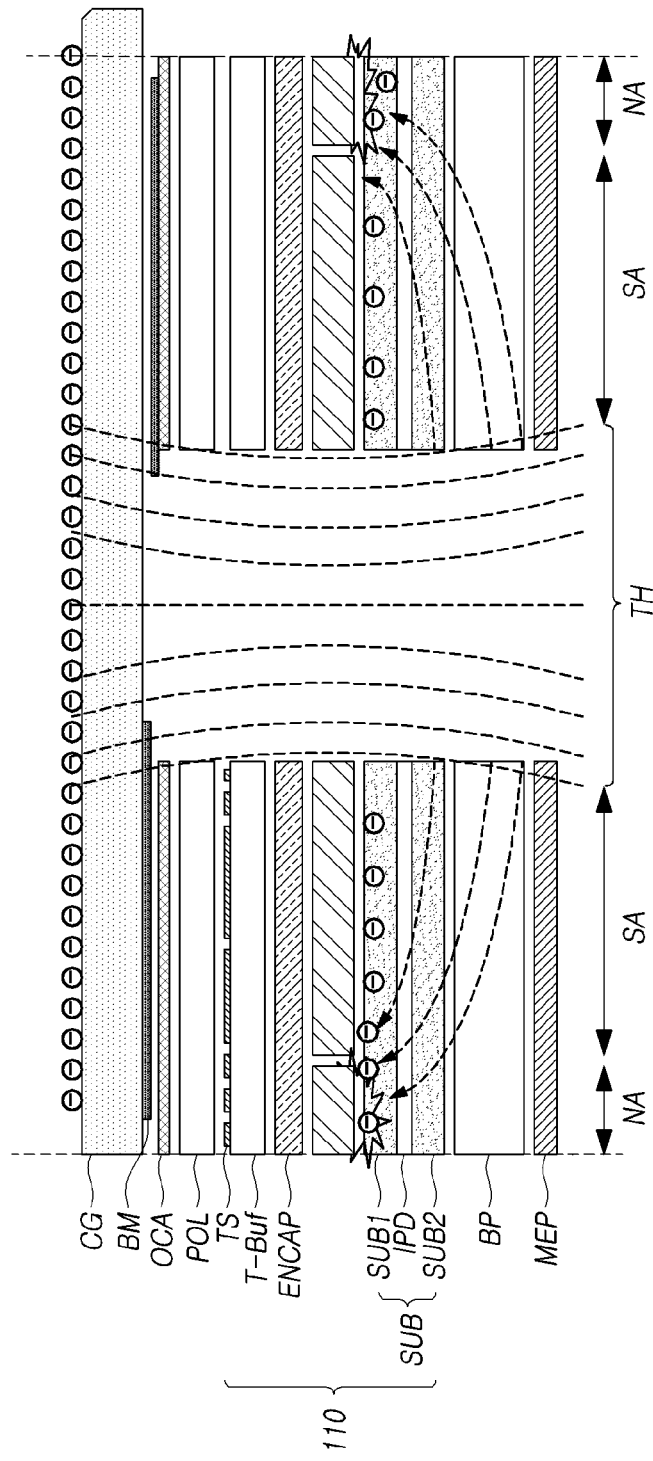
FIG. 6 is an exemplary cross-sectional view of an area in which a through hole of a display panel is located in a display device according to embodiments of the present disclosure.

FIG. 6 is an exemplary cross-sectional view of an area in which a through hole of a display panel is located in a display device according to embodiments of the present disclosure.

Referring to FIG. 6, there may be formed a display panel 110 including a substrate SUB, an organic light emitting device OLED, an encapsulation layer ENCAP, and a touch sensor TS as shown in FIGS. 3 to 5. A back plate BP may be disposed on a rear surface of the display panel 110. In the case that the substrate of the display panel 110 is made of a plastic material such as polyimide, the manufacturing process of the display device 100 proceeds in a situation in which a support substrate made of glass is disposed on the rear surface of the display panel 110, and the support substrate may be separated and released after completing the manufacturing process. Since components for supporting the display panel 110 are required even after the support substrate is released, the back plate BP for supporting the display panel 110 may be disposed on the rear surface of the display panel 110.

The back plate BP may prevent or at least reduce foreign substances from adhering to a lower part of the substrate SUB, and may serve to buffer shocks from the outside. The back plate BP may be formed of a plastic thin film formed of polymers such as polyimide (PI), polyethylene naphthalate (PEN), polyethylene terephthalate (PET), or a combination of these polymers.

A metal plate MEP (e.g., a metal layer) may be disposed on the rear surface of the back plate BP. The metal plate MEP may be made of a metal material such as a steel use stainless (SUS), and may function to radiate heat from the display device, ground, and protect the rear surface. That is, the metal plate MEP may be a composite heat dissipation sheet.

A polarizing plate POL (e.g., a polarizer) may suppress reflection of external light on the display panel 110. In one embodiment, the polarizer is in the non-optical area NA but not the optical area OA. If the display device 100 is used outdoors, external natural light may be introduced and reflected by a reflective layer included in the anode of the electroluminescent element, or may be reflected by an electrode made of a metal disposed under the electroluminescent element. The image of the display device 100 may not be easily recognized by the reflected lights. The polarizing plate POL may polarize light introduced from the outside in a specific direction, and prevent the reflected light from being emitted to the outside of the display device 100 again.

The polarizing plate POL may be a polarizing plate composed of a polarizer and a protective film protecting the same, or may be formed by coating a polarizing material for flexibility. A cover glass CG for protecting the exterior of the display panel 110 may be attached and disposed on the polarizing plate POL with an adhesive layer OCA interposed therebetween. That is, the cover glass CG is provided to cover a front surface of the display panel 110 and serves to protect the display panel 110.

A light blocking pattern BM may be formed on a rear edge of the cover glass CG. In addition, the light blocking pattern BM may be formed around the through hole TH. The light blocking pattern BM may extend and be formed to overlap a portion of the adhesive layer OCA, the polarizing plate POL, and the display panel 110 below, or may be configured as a separate layer. The light blocking pattern BM may be applied with black ink.

Referring to FIG. 6, friction charges generated on the surface of the cover glass CG may propagate through the through hole TH and penetrate the encapsulation layer ENCAP around the through hole TH thereby penetrating into the pixels inside the display panel 110. In this case, the friction charge may be transferred to the pixel adjacent to the through hole TH through the cathode electrode, which is a common layer having conductivity. That is, the friction charge penetrating into the display panel 110 may be supplied to the pixel to cause the organic light emitting diode OLED to emit light. Accordingly, there may occur a phenomenon that the pixel in the vicinity of the through-hole unnecessarily emits light due to the friction charge.

As described above, it will be described the pixel circuit configuration and driving of the pixel circuit for preventing the bright phenomenon around the through hole due to the friction charge with reference to FIGS. 7 and 8.

Figure 7:
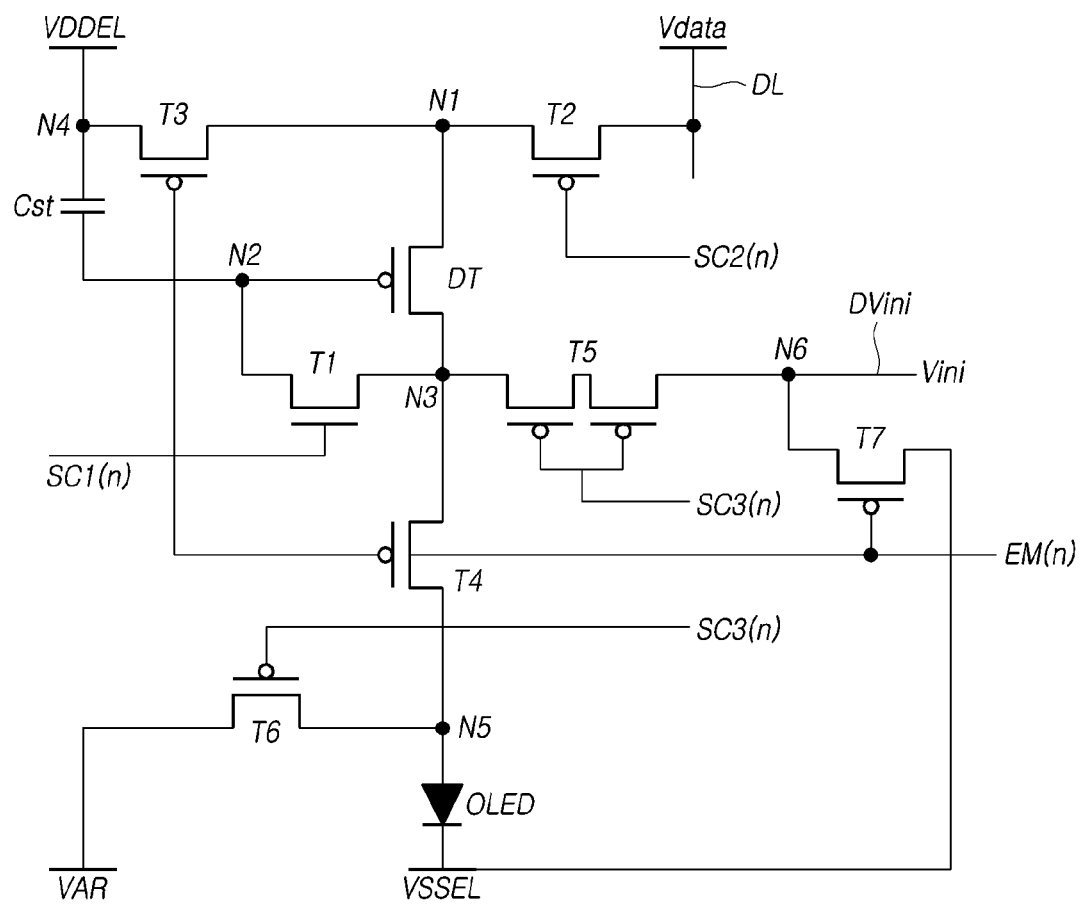
FIG. 7 is an equivalent circuit diagram of a pixel circuit in a display device according to embodiments of the present disclosure.

FIG. 7 is an equivalent circuit diagram of a pixel circuit in a display device according to embodiments of the present disclosure.

Referring to FIG. 7, each of the plurality of pixels P may include a pixel circuit including a driving transistor DT and a light emitting device OLED connected to the pixel circuit.

The pixel circuit may drive the light emitting device OLED by controlling a driving current Id flowing through the light emitting device OLED. The pixel circuit may include a driving transistor DT, first to sixth transistors T1 to T6, and a storage capacitor Cst. Each of the transistors DT and T1 to T6 may include a first electrode, a second electrode, and a gate electrode. One of the first and second electrodes may be a source electrode, and the other of the first and second electrodes may be a drain electrode.

Each of the transistors DT, T1 to T7 may be a PMOS transistor or an NMOS transistor. Hereinafter, there is illustrated an example in which the first transistor T1 is an NMOS transistor, and the other transistors DT, T2 to T7 are PMOS transistors. Accordingly, the first transistor T1 is turned on by applying a logic high voltage to the gate node, and the other transistors DT and T2 to T7 are turned on by applying a logic low voltage to the gate node.

According to an example, the first transistor T1 may serve as a compensation transistor, the second transistor T2 may serve as a data supply transistor, the third and fourth transistors T3 and T4 may serve as emission control transistors, the fifth and sixth transistors T5 and T6 may serve as bias transistors, and the seventh transistor T7 may serve as a driving power transistor.

The light emitting device OLED may include a pixel electrode (or an anode electrode) and a cathode electrode. The pixel electrode of the light emitting device OLED may be connected to the fifth node N5, and the cathode electrode of the light emitting device OLED may be connected to the second driving power VSSEL.

The driving transistor DT may include a first electrode connected to the first node N1, a second electrode connected to the third node N3, and a gate electrode connected to the second node N2. The driving transistor DT may provide the driving current Id to the light emitting device OLED based on the voltage (or the data voltage stored in the capacitor Cst to be described later) of the first node N1.

The first transistor T1 may include a first electrode connected to the second node N2, a second electrode connected to the third node N3, and a gate electrode receiving the first scan signal SC1(n). The first transistor T1 may be turned on in response to the first scan signal SC1(n) and may transfer the data signal Vdata applied to the third node N3 to the second node N2. The first transistor T1 may be diode-connected between the second node N2 and the third node N3 to sample the threshold voltage Vth of the driving transistor DT. The first transistor T1 may be a compensation transistor.

The second transistor T2 may include a first electrode connected to the data line DL (or receiving the data signal Vdata), a second electrode connected to the first node N1, and a gate electrode receiving the second scan signal SC2(n). The second transistor T2 may be turned on in response to the second scan signal SC2(n) and may transmit the data signal Vdata to the first node N1. The second transistor T2 may be a data supply transistor.

The third transistor T3 and the fourth transistor T4 (or the first and second emission control transistors) may be connected between the first driving power VDDEL and the light emitting device OLED, and may form a current path through which the driving current Id generated by the driving transistor DT flows.

The third transistor T3 may include a first electrode connected to a fourth node N4 to receive the first driving power ELVDD, a second electrode connected to the first node N1, and a gate electrode to receive the emission signal EM(n).

Similarly, the fourth transistor T4 may include a first electrode connected to a third node N3, a second electrode connected to a fifth node N5 (or the pixel electrode of the light emitting device OLED), and a gate electrode receiving the emission signal EM(n).

The third and fourth transistors T3 and T4 may be turned on in response to the emission signal EM(n), and in this case, the driving current Id is provided to the light emitting device OLED, and the light emitting device OLED may emit light with a luminance corresponding to the driving current Id.

The fifth transistor T5 may include a first electrode connected to the third node N3, a second electrode receiving a first bias voltage Vini, and a gate electrode for receiving a third scan signal SC3(n). The fifth transistor T5 may be turned on in response to the third scan signal SC3(n), and may selectively transmit an on-bias stress voltage Vobs (hereinafter referred to as "stress voltage") and an initialization voltage Vini to the third node N3. The fifth transistor T5 applies the voltage output from the gate driving circuit 230 to the driving transistor DT.

Since the fifth transistor T5 controls the high-voltage drain-source voltage Vds formed between the first electrode and the second electrode of the driving transistor DT, the fifth transistor T5 may be sensitive to a shift of the threshold voltage Vth of the fifth transistor T5. In addition, since the fifth transistor T5 is a PMOS transistor, the threshold voltage Vth of the fifth transistor T5 may be positively shifted due to the friction charge of the cover glass CG. Accordingly, the fifth transistor T5 may be configured as a double gate structure to reduce deterioration of the transistor. However, the present disclosure is not limited thereto, and the fifth transistor T5 may be configured as one transistor.

The sixth transistor T6 may include a first electrode connected to the fifth node N5, a second electrode connected to a second bias voltage VAR, and a gate electrode receiving the third scan signal SC3(n). The sixth transistor T6 may be turned on in response to the third scan signal SC3(n) before the light emitting device OLED emits light (or after the light emitting device OLED emits light), and may initialize the pixel electrode (or the anode electrode) of the light emitting device OLED by using the second bias voltage VAR. The light emitting device OLED may have a parasitic capacitor formed between the pixel electrode and the cathode electrode. In addition, the parasitic capacitor may be charged while the light emitting device OLED emits light, so that the pixel electrode of the light emitting device OLED may have a specific voltage. Accordingly, the amount of charge accumulated in the light emitting device OLED may be initialized by applying the second bias voltage VAR to the pixel electrode of the light emitting device OLED through the sixth transistor T6.

The seventh transistor T7 may include a first electrode connected to the sixth node N6, a second electrode connected to the second power voltage VSSEL, and a gate electrode receiving the emission signal EM(n). The seventh transistor T7 may be turned on in response to the emission signal EM(n) and may transmit the second driving power VSSEL to the sixth node N6. The seventh transistor T7 may be a driving power transistor.

In order to improve the positive shift of the threshold voltage Vth of the fifth transistor T5, the seventh transistor T7 may be turned on during the emission period Te in which the emission signal EM(n) is at a low level, and may continuously apply the second driving power VSSEL to the sixth node N6 to cancel the excitation current. That is, the seventh transistor T7 while turned on during the emission period Te provides a path to ground (e.g., VSSEL) to discharge charges of the excitation current.

The capacitor Cst may be connected or formed between the second node N2 and the fourth node N4. The capacitor Cst may store or maintain the provided data signal Vdata.

Figure 8A:
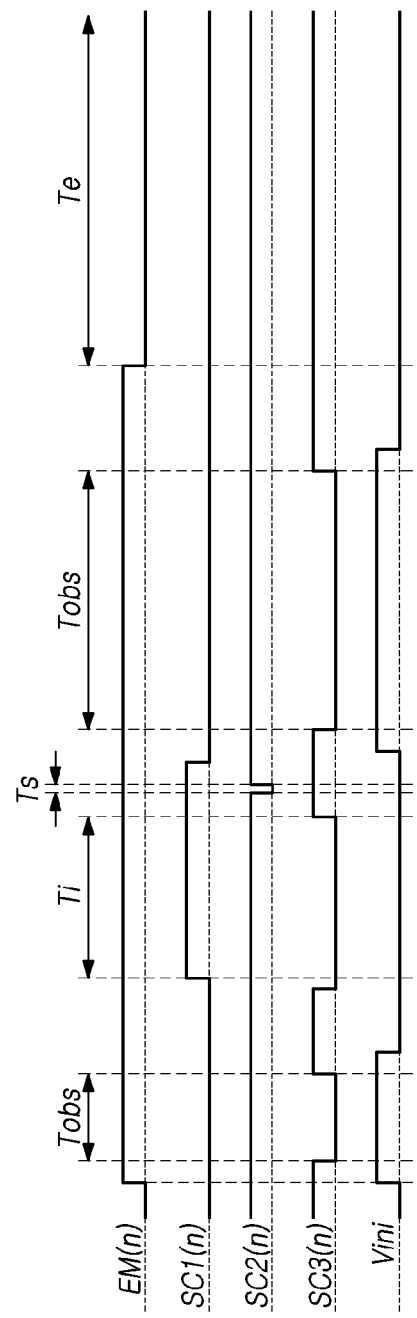
FIGS. 8A and 8B are diagrams for explaining driving of a pixel circuit in the display device of FIG. 7 according to embodiments of the present disclosure.
Figure 8B:
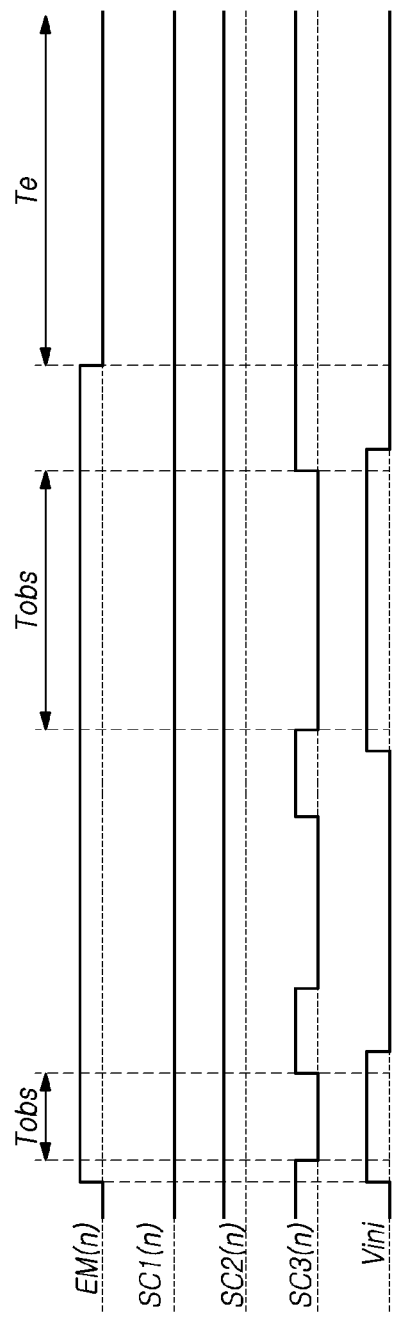

FIGS. 8A and 8B are diagrams for explaining driving of a pixel circuit in the display device of FIG. 7 according to one embodiment.

Referring to FIGS. 8A and 8B, each of the plurality of pixels P may initialize a voltage charged or remaining in the pixel circuit. Specifically, the influence of the data voltage Vdata and the driving voltage VDD stored in a previous frame may be removed. Accordingly, each of the plurality of pixels P may display an image corresponding to a new data voltage Vdata.

The operation of the pixel circuit may include at least one initialization period, a sampling period, and an emission period, but this is only an example and is not necessarily limited to this order.

The display device according to an embodiment of the present disclosure may be driven separately by a refresh frame shown in FIG. 8A and a reset frame shown in FIG. 8B. In the refresh frame, the data voltage Vdata is programmed in each pixel P, and the organic light emitting diode OLED emits light. In addition, the reset frame may be a vertical blank frame, and the anode electrode of the organic light emitting diode OLED may be reset during the reset frame.

In the display device according to the embodiment of the present disclosure, the refresh frame may be divided into an on-bias stress period Tobs (hereinafter referred to as a "stress period"), an initial period Ti, a sampling period Ts, an emission period Te, and an anode reset period (shown as the second on-bias stress period Tobs hereinafter referred to as a "reset period"). The stress period Tobs is a period in which a bias stress is applied to the first node N1 which is the source electrode of the driving transistor DT. The initial period Ti is a period for initializing the voltage of the third node N3 which is the drain electrode of the driving transistor DT. The sampling period Ts is a period for sampling the threshold voltage Vth of the driving transistor DT and programming the data voltage Vdata. The emission period Te is a period in which the organic light emitting diode OLED emits light according to a driving current by a source-gate voltage of the programmed driving transistor DT. The reset period is a period in which the voltage level of the anode electrode of the organic light emitting diode OLED is fixed to a reset voltage VAR for the remainder of the period except for the emission period Te.

Specifically, referring to FIG. 8A, during a first stress period Tobs, the third scan signal SC3($n$) is a low level that is a turn-on level. Accordingly, the sixth transistor T6 is turned on to apply the reset voltage VAR to the fifth node N5. That is, the anode electrode of the organic light emitting diode OLED is reset to the reset voltage VAR. The fifth transistor T5 is also turned on to apply the stress voltage Vobs from a digital initialization voltage line DVini to the third node N3. The stress voltage Vobs may be selected within a voltage range sufficiently higher than the operating voltage of the organic light emitting diode OLED, and may be set to be equal to or lower than the first driving power VDDEL. That is, a bias stress may be applied to the third node N3 that is the drain electrode of the driving transistor DT during the stress period Tobs to decrease the gate-source voltage Vgs of the driving transistor DT. Accordingly, a hysteresis effect of the driving transistor DT may be reduced by flowing the source-drain current Ids of the driving transistor DT during the stress period Tobs.

In this case, since the fifth transistor T5 operates as a switching transistor for supplying the stress voltage Vobs to the third node N3, there may flow an unintentional current caused by friction charges due to deterioration of the off-characteristics of the transistor to the organic light emitting diode OLED. Therefore, in order to prevent this problem, it is important to prevent the threshold voltage Vth from being shifted.

In addition, referring to FIG. 8A, during the initial period Ti, the first scan signal SC1($n$) is a high level that is a turn-on level, and the third scan signal SC3($n$) is a low level which is a turn-on level. Accordingly, the first transistor T1 and the fifth transistor T5 are turned on to apply the initialization voltage Vini from a digital initialization voltage line DVini to the second node N2. As a result, the gate electrode of the driving transistor DT is initialized to the initialization voltage Vini. The initialization voltage Vini may be selected within a voltage range sufficiently lower than the operating voltage of the organic light emitting diode OLED, and may be set to be equal to or lower than the second driving power VSSEL. In addition, in the initial period Ti, the sixth transistor T6 is turned on again, and the reset voltage VAR is applied to the fifth node N5.

In addition, referring to FIG. 8A, during the sampling period Ts, the first scan signal SC1($n$) is a high level that is a turn-on level, and the second scan signal SC2($n$) is a low level which is a turn-on level. Accordingly, during the sampling period Ts, the second transistor T2 is turned on, and the data voltage Vdata is applied to the first node N1. In addition, since the first transistor T1 is also turned on, the driving transistor DT is diode-connected and the gate electrode and the drain electrode of the driving transistor DT are short-circuited, so that the driving transistor DT operates like a diode.

In the sampling period Ts, a current Ids flows between the source electrode and the drain electrode of the driving transistor DT. Since the gate electrode and the drain electrode of the driving transistor DT are in a diode-connected state, the voltage of the second node N2 may be changed (e.g., may rise) until the gate-source voltage Vgs of the driving transistor DT becomes the threshold voltage Vth of the driving transistor DT by the current flowing from the source electrode to the drain electrode.

In addition, referring to FIG. 8A, during a second stress period Tobs, the third scan signal SC3($n$) is a low level that is a turn-on level. Accordingly, the sixth transistor T6 is turned on to apply the reset voltage VAR to the fifth node N5. That is, the anode electrode of the organic light emitting diode OLED is reset to the reset voltage VAR. In addition, the fifth transistor T5 is turned on to apply the stress voltage Vobs to the third node N3. That is, the hysteresis effect of the driving transistor DT may be reduced by applying a bias stress to the third node N3 that is the drain electrode of the driving transistor DT during the second stress period Tobs.

In addition, referring to FIG. 8A, during the emission period Te, the emission signal EM(n) is a low level that is a turn-on level. Accordingly, the third transistor T3 is turned on to apply the first driving power VDDEL to the first node N1. Also, since the second node N2 is coupled to the first driving power VDDEL through the storage capacitor Cst, the first driving power VDDEL is also reflected in the second node N2. In addition, the fourth transistor T4 is also turned on to form a current path between the third node N3 and the fourth node N4. As a result, the driving current Ioled passing through the source electrode and the drain electrode of the driving transistor DT is applied to the organic light emitting diode OLED.

In addition, referring to FIG. 8A, when the emission signal EM(n) is at a low level, the seventh transistor T7 is turned on to apply the second driving power VSSEL to the sixth node N6.

As the friction charges formed on a surface of the cover glass CG penetrate into the pixel through the through hole TH, the threshold voltage Vth of the fifth transistor T5 may be positively shifted. As a result, the potential difference between the drain-source voltage Vds of the fifth transistor T5 may be increased, and thus the off-characteristic of the transistor may be deteriorated. As a result, the amount of current of the organic light emitting diode OLED that emits light according to the driving current is unnecessarily increased during the emission period Te, so that the pixels around the through hole TH emit bright light.

Accordingly, the seventh transistor T7 may be connected between the sixth node N6, which is the source electrode of the fifth transistor T5, and the cathode electrode of the organic light emitting diode OLED to which the second driving power VSSEL is supplied, and may be turned on according to emission signal EM(n), thereby the excitation current may be canceled.

That is, in the display device according to the embodiment of the present disclosure, a ground path (e.g., a path to ground) is formed in the fifth transistor T5 through the seventh transistor T7, so that there may cancel (e.g., reduce or discharge) the excitation current generated as the friction charge on the surface of the cover glass CG penetrates the pixels inside the display panel 110 and positively shifts the threshold voltage Vth of the fifth transistor T5. Accordingly, there may be improved a brightness phenomenon occurring due to an unintentionally increased amount of current in the pixel adjacent to the through hole TH, and thus image quality may be improved.

In addition, referring to FIG. 8B, during the reset frame, the first scan signal SC1($n$) is maintained at a low level that is a turn-off level, and the second scan signal SC2($n$) is also maintained at a high level which is a turn-off level. Accordingly, the data voltage Vdata is not programmed in each pixel P during the reset frame.

However, the third scan signal SC3($n$) may swing periodically. That is, since the third scan signal SC3($n$) periodically swings, the reset frame may include a plurality of stress periods Tobs.

That is, during the reset frame, the anode electrode of the organic light emitting diode OLED is reset to the reset voltage VAR, and a bias stress may be applied to the third node N3 that is the drain electrode of the driving transistor DT.

As a result, in the display device according to the embodiment of the present disclosure, the anode electrode of the organic light emitting diode OLED may be periodically reset over the refresh frame and the reset frame. Accordingly, since the continuous increase of the voltage of the anode electrode of the organic light emitting diode OLED due to the leakage current may be prevented, the anode electrode of the organic light emitting diode OLED may maintain a constant voltage level. Accordingly, the change in luminance of the display device may be minimized and image quality may be improved.

Figure 9A:
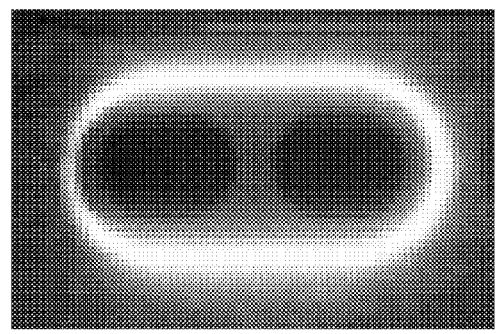
FIGS. 9A and 9B are diagrams illustrating comparative examples and examples in a display device according to embodiments of the present disclosure.
Figure 9A:
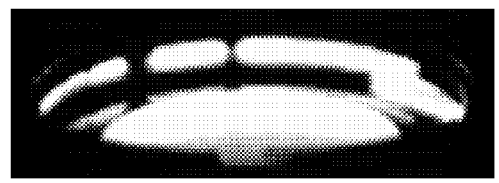
Figure 9B:
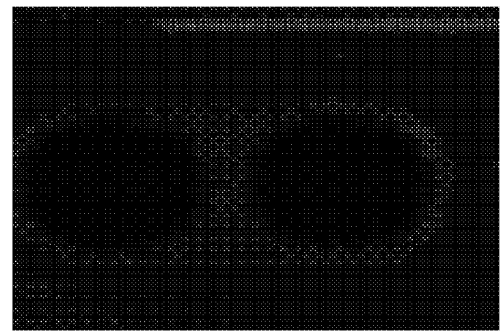
Figure 9B:
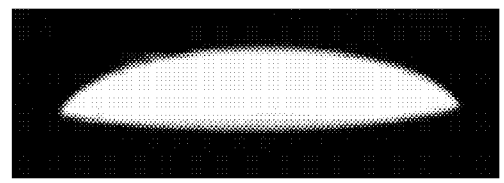

FIGS. 9A and 9B are diagrams illustrating comparative examples and examples in a display device according to embodiments of the present disclosure.

Referring to FIGS. 9A and 9B, the comparative example of FIG. 9A is a photograph of the operation of a conventional pixel circuit, and the embodiment of FIG. 9B is a photograph of the operation of a pixel circuit further including the seventh transistor T7.

As shown in FIG. 9A, in the comparative example, there is a phenomenon in which pixels adjacent to the through hole TH emit bright light. However, as shown in FIG. 9B, in the example according to an embodiment of the present disclosure, since the excitation current is canceled by applying the second driving power VSSEL to the sixth node N6 while the emission signal EM(n) is at the turn-on level, there may prevent the brightness phenomenon as in the comparative example, and may improve image quality.

A display panel and a display device according to an embodiment of the present specification may be described as follows.

In one embodiment, a display panel comprises: a pixel in a display area of the display panel, the pixel including: a light emitting device configured to emit light responsive to a driving current; a driving transistor configured to supply the driving current; and a plurality of switching transistors configured to control the supply of the driving current to the light emitting device by the driving transistor, wherein at least one of the plurality of switching transistors is configured to provide a path to ground through which an excitation current exits within the pixel.

In one embodiment, the light emitting device includes a cathode electrode and the display panel further comprises: an initialization voltage line connected to the pixel, wherein the plurality of switching transistors comprise a driving power transistor configured to control an electrical connection between the initialization voltage line and the cathode electrode of the light emitting device, and the path to ground includes the driving power transistor.

In one embodiment, the plurality of switching transistors further comprise: a bias transistor configured to control a connection between a source electrode or a drain electrode of the driving transistor and the initialization voltage line, wherein the ground path is configured between the source electrode or the drain electrode of the driving transistor and the cathode electrode such that the ground path includes the bias transistor and the driving power transistor.

In one embodiment, the excitation current is generated according to a change in a threshold voltage of the bias transistor.

In one embodiment, the at least one of the plurality of switching transistors configured to provide the path to ground comprises: a first transistor connected to a drain electrode or a source electrode of the driving transistor; and a second transistor connected to the first transistor, the second transistor configured to provide the path to ground for the first transistor while the light emitting device emits the light.

In one embodiment, the plurality of switching transistors further comprises: a third transistor connected between the driving transistor and the light emitting device, wherein a gate electrode of the third transistor is connected to a gate electrode of the second transistor.

In one embodiment, the second transistor is connected to a cathode electrode of the light emitting device.

In one embodiment, a display panel comprises: a light emitting device including a first electrode, a light emitting layer, and a second electrode; a driving transistor configured to drive the light emitting device; a bias transistor configured to control a connection between a drain electrode or a source electrode of the driving transistor and an initialization voltage line; and a driving power transistor configured to control an electrical connection between the initialization voltage line and the second electrode of the light emitting device.

In one embodiment, the display panel further comprises: an emission control transistor configured to control the light emission of the light emitting device, wherein a gate electrode of the driving power transistor is electrically connected to a gate electrode of the emission control transistor.

In one embodiment, the emission control transistor is between the driving transistor and the light emitting device.

In one embodiment, the bias transistor is connected to a drain electrode or a source electrode of the driving transistor and the driving power transistor is connected to a drain electrode or a source electrode of the bias transistor and the second electrode of the light emitting device.

In one embodiment, a display device comprises: a display panel including an optical area and a non-optical area, the optical area including a transmissive area and the non-optical area including a light emitting device in a light emitting area of a pixel; and a cover glass on the display panel, wherein the pixel is configured to provide a path to ground through which an excitation current exits within the pixel, the path to ground excluding the light emitting device.

In one embodiment, the light emitting device is configured to emit light responsive to a driving current, the light emitting device including a first electrode, a light emitting layer, and a second electrode, wherein the pixel further comprises: a driving transistor configured to supply the driving current; and a plurality of switching transistors configured to control the supply of the driving current to the light emitting device by the driving transistor, the plurality of switching transistors including a driving power transistor configured to provide the path to ground through which an excitation current generated in the pixel exits.

In one embodiment, the driving power transistor is connected between an initialization voltage line connected to the pixel and the second electrode.

In one embodiment, the plurality of switching transistors further comprises: a bias transistor connected to a drain electrode or a source electrode of the driving transistor and the initialization voltage line, the bias transistor configured to supply a voltage provided by the initialization voltage line to the drain electrode or the source electrode of the driving transistor, wherein the driving power transistor is connected between the second electrode of the light emitting device and a drain electrode or a source electrode of the bias transistor.

In one embodiment, the display device further comprises: a polarizer in the non-optical area but not the optical area.

In one embodiment, the optical area lacks any transistors.

In one embodiment, the display device further comprises: a substrate including a first side and a second side opposite the first side; and a metal layer on the second side, the metal layer configured to at least radiate heat from the display device.

In one embodiment, the display device further comprises: an optical device that overlaps the optical area.

In one embodiment, the excitation current is generated by allowing charged charges generated on a surface of the cover glass to penetrate into the pixel through the transmissive area.

Features, structures, effects, etc. described in the above-described examples of the present disclosure are included in at least one embodiment of the present disclosure, and are not necessarily limited to only one embodiment. Furthermore, features, structures, effects, etc. illustrated in at least one example of the present disclosure may be combined or modified with respect to other examples by those of ordinary skill in the art to which this disclosure belongs. Accordingly, the contents related to such combinations and modification should be interpreted as being included in the scope of the present disclosure.

Although the embodiments of the present disclosure have been described in more detail with reference to the accompanying drawings, the present invention is not necessarily limited to these embodiments, and various modifications may be possible within the scope without departing from the technical spirit of the present invention. Accordingly, the embodiments disclosed in the present disclosure are not intended to limit the technical spirit of the present invention, but to exemplarily explain the present invention, and the scope of the technical spirit of the present invention is not limited by these embodiments. Therefore, there should be understood that the embodiments described above are illustrative in all respects and not restrictive. The protection scope of the present invention should be construed by the following claims, and all technical ideas within the scope equivalent thereto should be construed as being included in the scope of the present invention.

What is claimed is:

1. A display panel comprising:
    a pixel in a display area of the display panel, and
    an initialization voltage line connected to the pixel,
    the pixel including:
        a light emitting device configured to emit light responsive to a driving current;
        a driving transistor configured to supply the driving current; and
        a plurality of switching transistors configured to control the supply of the driving current to the light emitting device by the driving transistor,
        wherein at least one of the plurality of switching transistors is configured to provide a path to ground through which an excitation current exits within the pixel,
        wherein the light emitting device includes a cathode electrode,
        wherein the plurality of switching transistors comprise a driving power transistor configured to control an electrical connection between the initialization voltage line and the cathode electrode of the light emitting device, and the path to ground includes the driving power transistor.

2. The display panel of claim 1, wherein the plurality of switching transistors further comprise:
    a bias transistor configured to control a connection between a source electrode or a drain electrode of the driving transistor and the initialization voltage line,
    wherein the path to ground is configured between the source electrode or the drain electrode of the driving transistor and the cathode electrode such that the path to ground includes the bias transistor and the driving power transistor.

3. The display panel of claim 2, wherein the excitation current is generated according to a change in a threshold voltage of the bias transistor.

4. A display panel comprising:
    a pixel in a display area of the display panel, the pixel including:
        a light emitting device configured to emit light responsive to a driving current;
        a driving transistor configured to supply the driving current; and
        a plurality of switching transistors configured to control the supply of the driving current to the light emitting device by the driving transistor,
        wherein at least one of the plurality of switching transistors is configured to provide a path to ground through which an excitation current exits within the pixel,
        wherein the at least one of the plurality of switching transistors configured to provide the path to ground comprises:
            a first transistor connected to a drain electrode or a source electrode of the driving transistor; and
            a second transistor connected to the first transistor, the second transistor configured to provide the path to ground for the first transistor while the light emitting device emits the light.

5. The display panel of claim 4, wherein the plurality of switching transistors further comprises:
    a third transistor connected between the driving transistor and the light emitting device,
    wherein a gate electrode of the third transistor is connected to a gate electrode of the second transistor.

6. The display panel of claim 4, wherein the second transistor is connected to a cathode electrode of the light emitting device.

7. A display panel comprising:
    a light emitting device including a first electrode, a light emitting layer, and a second electrode;
    a driving transistor configured to drive the light emitting device;
    a bias transistor configured to control a connection between a drain electrode or a source electrode of the driving transistor and an initialization voltage line; and
    a driving power transistor configured to control an electrical connection between the initialization voltage line and the second electrode of the light emitting device.

8. The display panel of claim 7, further comprising:
    an emission control transistor configured to control the light emission of the light emitting device,
    wherein a gate electrode of the driving power transistor is electrically connected to a gate electrode of the emission control transistor.

9. The display panel of claim 8, wherein the emission control transistor is between the driving transistor and the light emitting device.

10. The display panel of claim 7, wherein the bias transistor is connected to a drain electrode or a source electrode of the driving transistor and the driving power transistor is connected to a drain electrode or a source electrode of the bias transistor and the second electrode of the light emitting device.

11. A display device comprising:
a display panel including an optical area and a non-optical area, the optical area including a transmissive area and the non-optical area including a light emitting device in a light emitting area of a pixel; and
a cover glass on the display panel,
wherein the pixel is configured to provide a path to ground through which an excitation current exits within the pixel, the path to ground excluding the light emitting device.

12. The display device of claim 11, wherein the light emitting device is configured to emit light responsive to a driving current, the light emitting device including a first electrode, a light emitting layer, and a second electrode, wherein the pixel further comprises:
a driving transistor configured to supply the driving current; and
a plurality of switching transistors configured to control the supply of the driving current to the light emitting device by the driving transistor, the plurality of switching transistors including a driving power transistor configured to provide the path to ground through which an excitation current generated in the pixel exits.

13. The display device of claim 12, wherein the driving power transistor is connected between an initialization voltage line connected to the pixel and the second electrode.

14. The display device of claim 13, wherein the plurality of switching transistors further comprises:
a bias transistor connected to a drain electrode or a source electrode of the driving transistor and the initialization voltage line, the bias transistor configured to supply a voltage provided by the initialization voltage line to the drain electrode or the source electrode of the driving transistor,
wherein the driving power transistor is connected between the second electrode of the light emitting device and a drain electrode or a source electrode of the bias transistor.

15. The display device of claim 11, further comprising:
a polarizer in the non-optical area but not the optical area.

16. The display device of claim 11, wherein the optical area lacks any transistors.

17. The display device of claim 11, further comprising:
a substrate including a first side and a second side opposite the first side; and
a metal layer on the second side, the metal layer configured to at least radiate heat from the display device.

18. The display device of claim 11, further comprising:
an optical device that overlaps the optical area.

19. The display device of claim 11, wherein the excitation current is generated by allowing charged charges generated on a surface of the cover glass to penetrate into the pixel through the transmissive area.

* * * * *